United States Patent
Hains et al.

(10) Patent No.: US 10,619,076 B2
(45) Date of Patent: Apr. 14, 2020

(54) SELF-STOPPING POLISHING COMPOSITION AND METHOD FOR BULK OXIDE PLANARIZATION

(71) Applicant: Cabot Microelectronics Corporation, Aurora, IL (US)

(72) Inventors: Alexander W. Hains, Aurora, IL (US); Juyeon Chang, Hwaseong-si (KR); Tina C. Li, Warrenville, IL (US); Viet Lam, Naperville, IL (US); Ji Cui, Hsin-Chu (TW); Sarah Brosnan, St. Charles, IL (US); Chul Woo Nam, Naperville, IL (US)

(73) Assignee: Cabot Microelectronics Corporation, Aurora, IL (US)

(*) Notice: Subject to any disclaimer, the term of this patent is extended or adjusted under 35 U.S.C. 154(b) by 0 days.

(21) Appl. No.: 16/271,508

(22) Filed: Feb. 8, 2019

(65) Prior Publication Data
US 2019/0185716 A1    Jun. 20, 2019

Related U.S. Application Data

(60) Division of application No. 15/934,219, filed on Mar. 23, 2018, which is a continuation-in-part of application No. 15/207,973, filed on Jul. 12, 2016, now Pat. No. 10,029,345.

(60) Provisional application No. 62/486,219, filed on Apr. 17, 2017, provisional application No. 62/191,824, filed on Jul. 13, 2015.

(51) Int. Cl.
*C09G 1/02* (2006.01)
*H01L 21/3105* (2006.01)
*H01L 21/762* (2006.01)

(52) U.S. Cl.
CPC .......... *C09G 1/02* (2013.01); *H01L 21/31053* (2013.01); *H01L 21/762* (2013.01)

(58) Field of Classification Search
CPC ....................................................... C09G 1/02
USPC ....................................................... 438/693
See application file for complete search history.

(56) References Cited

U.S. PATENT DOCUMENTS

2004/0152309 A1* 8/2004 Carter ................... C03C 19/00
                                                              438/689
2006/0096179 A1* 5/2006 Lu ........................... B82Y 30/00
                                                               51/307

* cited by examiner

*Primary Examiner* — Roberts P Culbert
(74) *Attorney, Agent, or Firm* — Thomas Omholt; Erika S. Wilson; Derek W. Barnett

(57) ABSTRACT

The invention provides a chemical-mechanical polishing composition comprising an abrasive, a self-stopping agent, an aqueous carrier, and optionally, a cationic polymer, and provides a method suitable for polishing a substrate.

8 Claims, 2 Drawing Sheets

SELF-STOPPING POLISHING COMPOSITION AND METHOD FOR BULK OXIDE PLANARIZATION

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. More specifically, shallow trench isolation (STI) is a process in which a silicon nitride layer is formed on a silicon substrate, shallow trenches are formed via etching or photolithography, and a dielectric layer is deposited to fill the trenches. Due to variation in the depth of trenches formed in this manner, it is typically necessary to deposit an excess of dielectric material on top of the substrate to ensure complete filling of all trenches. The dielectric material (e.g., a silicon oxide) conforms to the underlying topography of the substrate.

Thus, after the dielectric material has been placed, the surface of the deposited dielectric material is characterized by an uneven combination of raised areas of the dielectric material separated by trenches in the dielectric material, the raised areas and trenches of the dielectric material aligning with corresponding raised areas and trenches of the underlying surface. The region of the substrate surface that includes the raised dielectric material and trenches is referred to as a pattern field of the substrate, e.g., as "pattern material," "pattern oxide," or "pattern dielectric." The pattern field is characterized by a "step height," which is the difference in height of the raised areas of the dielectric material relative to the trench height.

The excess dielectric material is typically removed by a CMP process, which additionally provides a planar surface for further processing. During removal of the raised area material, an amount of material from the trenches also will be removed. This removal of material from the trenches is referred to as "trench erosion" or "trench loss." Trench loss is the amount (thickness, e.g., in Angstroms (Å)) of material removed from trenches in achieving planarization of pattern dielectric material by eliminating an initial step height. Trench loss is calculated as the initial trench thickness minus a final trench thickness. Desirably, the rate of removal of material from trenches is well below the rate of removal from raised areas. Thus, as material of the raised areas is removed (at a faster rate compared to material being removed from the trenches) the pattern dielectric becomes a highly planarized surface that may be referred to as a "blanket" region of the processed substrate surface, e.g., "blanket dielectric" or "blanket oxide."

A polishing composition can be characterized according to its polishing rate (i.e., removal rate) and its planarization efficiency. The polishing rate refers to the rate of removal of a material from the surface of the substrate and is usually expressed in terms of units of length (thickness, e.g., in Angstroms (Å)) per unit of time (e.g., per minute). Different removal rates relating to different regions of a substrate, or to different stages of a polishing step, can be important in assessing process performance. A "pattern removal rate" is the rate of removal of dielectric material from raised areas of pattern dielectric layer at a stage of a process during which a substrate exhibits a substantial step height. "Blanket removal rate" refers to a rate of removal of dielectric material from planarized (i.e., "blanket") areas of a pattern dielectric layer at an end of a polishing step, when step height has been significantly (e.g., essentially entirely) reduced. Planarization efficiency relates to step height reduction versus amount of material removed from the substrate (i.e., step height reduction divided by trench loss). Specifically, a polishing surface, e.g., a polishing pad, first contacts the "high points" of the surface and must remove material in order to form a planar surface. A process that results in achieving a planar surface with less removal of material is considered to be more efficient than a process requiring removal of more material to achieve planarity.

Often the rate of removal of the silicon oxide pattern material can be rate-limiting for the dielectric polishing step in STI processes, and therefore high removal rates of the silicon oxide pattern are desired to increase device throughput. However, if the blanket removal rate is too rapid, overpolishing of oxide in exposed trenches results in trench erosion and increased device defectivity. Overpolishing and associated trench loss can be avoided if the blanket removal rate is lowered.

It is desirable in certain polishing applications for a CMP composition to exhibit "self-stopping" behavior such that when a large percentage of the "high points" of the surface (i.e., raised areas) have been removed, the removal rate decreases. In self-stopping polishing applications, the removal rate is effectively high while a significant step height is present at the substrate surface and then the removal rate is lowered as the surface becomes effectively planar. In various dielectric polishing steps (e.g., of an STI process) the rate of removal of pattern dielectric material (e.g., dielectric layer) is typically a rate-limiting factor of the overall process. Therefore, high removal rates of pattern dielectric material are desired to increase throughput. Good efficiency in the form of relatively low trench loss is also desirable. Further, if the removal rate of dielectric remains high after achieving planarization, overpolishing occurs, resulting in added trench loss.

Advantages of self-stopping slurries result from the reduced blanket removal rate, which produces a wide endpoint window. For example, self-stopping behavior allows for polishing of substrates having reduced dielectric film thickness, allowing for a reduced amount of material to be deposited over a structured lower layer. Also, motor torque endpoint detection can be used for more effective monitoring of final topography. Substrates can be polished with lower trench loss by avoiding overpolishing or unnecessary removal of dielectric after planarization.

Self-stopping CMP compositions currently have been developed based on ceria/anionic polyelectrolyte systems. For example, U.S. Patent Application Publication 2008/0121839 discloses a polishing composition comprising inorganic abrasives, polyacrylic acid/maleic acid copolymer, and gemini surfactant. Korean Patent No. 10-1524624 discloses a polishing composition comprising ceria, a carboxylic acid, and mixed amine compounds (English-language abstract). International Patent Application Publication No. WO 2006/115393 discloses a polishing composition comprising ceria, a hydroxycarboxylic acid, and an amino alcohol. However, as the structure of semiconductor devices becomes more complicated and especially as NAND technology is moved from 2D to 3D, current self-stopping CMP compositions, due to the use of anionic polymer, are being challenged by the limited step height reduction rate brought about by electrostatic repulsion between the abrasive and the silicon oxide surface.

A need remains for compositions and methods for chemical-mechanical polishing of silicon oxide-containing substrates that will provide useful removal rates while also providing improved planarization efficiency. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising an abrasive, a self-stopping agent, an aqueous carrier, and optionally a cationic compound, as well as a method suitable for polishing a substrate using the inventive polishing composition.

More specifically, the invention provides a chemical-mechanical polishing composition comprising (a) an abrasive, (b) a self-stopping agent of the formula Q-B, wherein Q may be a substituted or unsubstituted hydrophobic group, or a group imparting a steric hindrance, B is a binding group, wherein the binding group has the structure; C(O)—X—OH or —C(O)—OH, wherein X is a C1-C2 alkyl group, and (c) an aqueous carrier, wherein the polishing composition has a pH of about 3 to about 9.

The invention also provides a chemical-mechanical polishing composition comprising (a) an abrasive comprising ceria, (b) a self-stopping agent selected from kojic acid (5-Hydroxy-2-(hydroxymethyl)-4H-pyran-4-one), crotonic acid ((E)-2-butenoic acid), tiglic acid ((2E)-2-Methylbut-2-enoic acid), valeric acid (pentanoic acid), 2-pentenoic acid, maltol (3-Hydroxy-2-methyl-4H-pyran-4-one), benzoic acid, 3,4-dihydroxybenzoic acid, 3,5-dihydroxybenzoic acid, caffeic acid, ethyl maltol, potassium sorbate, sorbic acid, and combinations thereof, and (c) an aqueous carrier, wherein the polishing composition has a pH of about 3 to about 9.

The invention also provides a chemical-mechanical polishing composition comprising (a) an abrasive comprising ceria, (b) a self-stopping agent selected from a compound of formula (I):

wherein R is selected from the group consisting of hydrogen, alkyl, cycloalkyl, aryl, heterocyclic alkyl, and heterocyclic aryl, each of which may be substituted or unsubstituted; a compound of formula (II):

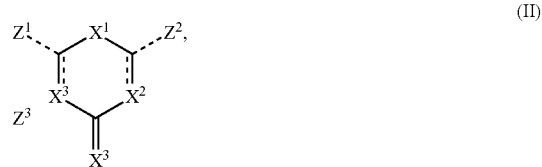

wherein each of $X^1$-$X^3$ is independently selected from N, O, S, a $sp^2$-hybridized carbon, and $CY^1Y^2$, wherein each of $Y^1$ and $Y^2$ is independently selected from hydrogen, hydroxyl, $C_1$-$C_6$ alkyl, halogen, and combinations thereof, and each of $Z^1$-$Z^3$ is independently selected from hydrogen, hydroxyl, $C_1$-$C_6$ alkyl, and combinations thereof, each of which may be substituted or unsubstituted; a compound of formula (III):

$$Z-(C(X^1X^2)_n)_p-CO_2M \quad (III),$$

wherein Z is selected from $C_1$-$C_6$ alkyl, $C_1$-$C_6$ alkenyl, $C_1$-$C_6$ alkynyl, and aryl (e.g., phenyl, benzyl, naphthyl, azulene, anthracene, pyrene, etc.), $X^1$ and $X^2$ are independently selected from hydrogen, hydroxy, amino, and $C_1$-$C_6$ alkyl, and wherein $X^1$ and $X^2$ taken together with the attached carbon can form a $sp^2$-hybridized carbon, n is 1 or 2, p is 0-4, and M is selected from hydrogen and a suitable counterion (e.g., a group I metal), each of which may be substituted or unsubstituted; and combinations thereof; a compound of formula (IV):

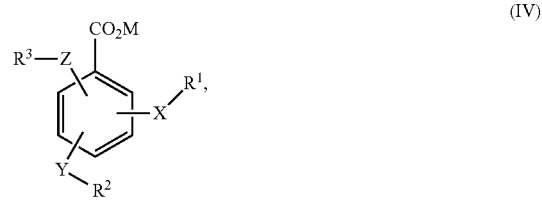

where X, Y, and Z are independently selected from H, O, S, NH, and $CH_2$, $R^1$, $R^2$ and $R^3$ are independently selected from H, alkyl, alkenyl, alkynyl, aryl, halo, and haloalkyl, and M is selected from hydrogen and a suitable counterion, (c) optionally a cationic polymer and (d) an aqueous carrier, wherein the polishing composition has a pH of about 3 to about 9.

The invention further provides a method of chemically-mechanically polishing a substrate comprising (i) providing a substrate, wherein the substrate comprises a pattern dielectric layer on a surface of the substrate, wherein the pattern dielectric layer comprises a raised area of dielectric material (e.g., active area vs. peri area), and wherein the initial step height of the pattern dielectric layer describes the oxide thickness range (e.g., active vs. peri), (iii) providing a chemical-mechanical polishing composition as described herein, (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

DETAILED DESCRIPTION OF THE INVENTION

Figure 1:
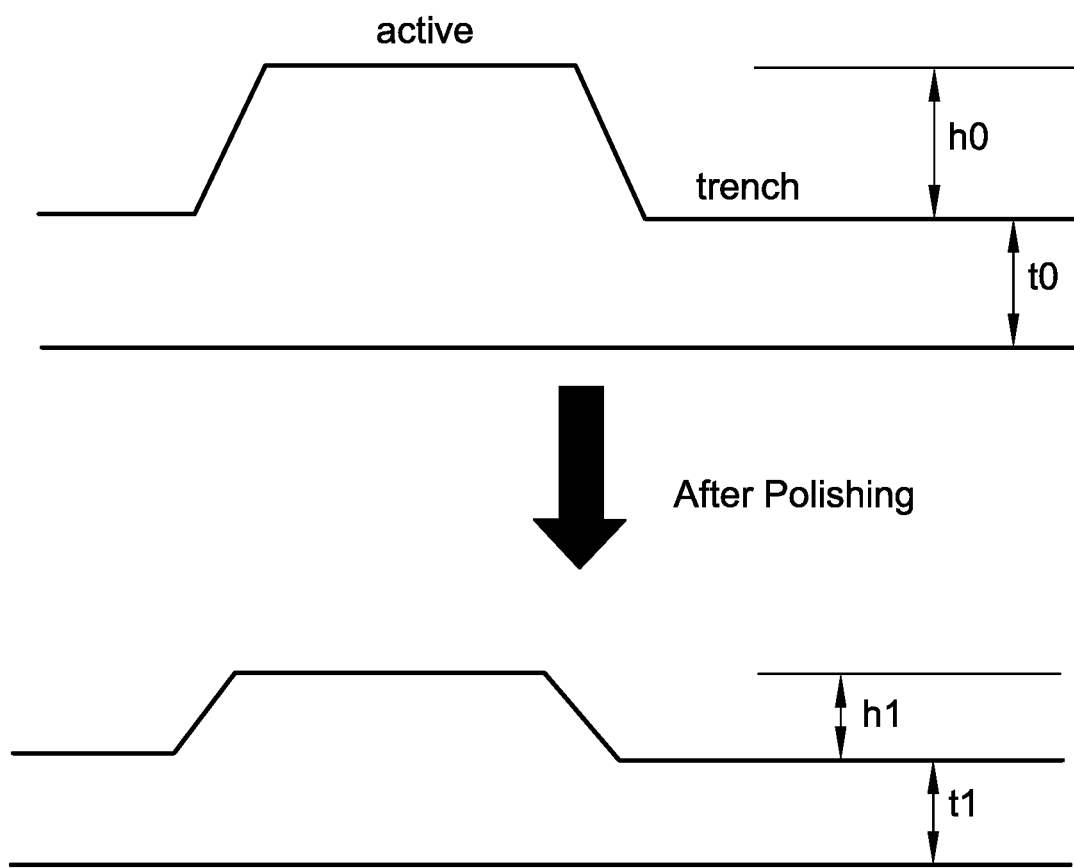
FIG. 1 (not to scale) illustrates a cross-sectional view of an example substrate to illustrate active area, trench areas, step height, and trench loss.

The invention provides a chemical-mechanical polishing composition comprising (a) an abrasive, (b) a self-stopping agent of the formula Q-B, wherein Q may be a substituted or unsubstituted hydrophobic group, or a group imparting a steric hindrance, B is a binding group, wherein the binding group has the structure; C(O)—X—OH or —C(O)—OH, wherein X is a $C_1$-$C_2$ alkyl group, and (c) an aqueous carrier, wherein the polishing composition has a pH of about 3 to about 9.

The polishing composition of the invention comprises an abrasive. The abrasive of the polishing composition desirably is suitable for polishing a non-metal portion of the substrate (e.g., pattern dielectric material, blanket dielectric material, pattern oxide material, blanket oxide material, etc.). Suitable abrasives include ceria (e.g., $CeO_2$), zirconia (e.g., $ZrO_2$), silica (e.g., $SiO_2$), and combinations thereof.

In a preferred embodiment, the abrasive is selected from ceria, zirconia, and combinations thereof. In another preferred embodiment, the abrasive is ceria.

Both ceria abrasives and zirconia abrasives are well known in the CMP art and are commercially available. Examples of suitable ceria abrasives include wet-process ceria, calcined ceria, and metal-doped ceria, among others. Examples of suitable zirconia abrasives include metal-doped zirconia and non-metal-doped zirconia, among others. Among metal doped zirconia are cerium-, calcium-, magnesium-, or yttrium-doped zirconia with dopant element weight percentage preferentially in a range from 0.1-25%.

Ceria abrasives suitable for use in the inventive polishing compositions, and processes for their preparation, are described in U.S. patent application Ser. No. 14/639,564, filed Mar. 5, 2015, entitled "Polishing Composition Containing Ceria Abrasive," now U.S. Pat. No. 9,505,952, and U.S. patent application Ser. No. 15/207,973, filed Jul. 12, 2016, entitled "Methods and Compositions for Processing Dielectric Substrate," published as U.S. Patent Application Publication No. 2017/0014969, the disclosures of which are incorporated by reference herein.

A preferred abrasive is wet-process ceria particles. The polishing composition can comprise a single type of abrasive particles or multiple different types of abrasive particles, based on size, composition, method of preparation, particle size distribution, or other mechanical or physical properties. Ceria abrasive particles can be made by a variety of different processes. For example, ceria abrasive particles can be precipitated ceria particles or condensation-polymerized ceria particles, including colloidal ceria particles.

The ceria abrasive particles can be made by any suitable process. As an example, the ceria abrasive particles can be wet-process ceria particles made according to the following process. Typically, the first step in synthesizing wet-process ceria particles is to dissolve a ceria precursor in water. The ceria precursor can be any suitable ceria precursor, and can include a ceria salt having any suitable charge, e.g., $Ce^{3+}$ or $Ce^{4+}$. Suitable ceria precursors include, for example, cerium III nitrate, cerium IV ammonium nitrate, cerium III carbonate, cerium IV sulfate, and cerium III chloride. Preferably, the ceria precursor is cerium III nitrate.

The pH of the ceria precursor solution typically is increased to form amorphous $Ce(OH)_3$. The pH of the solution can be increased to any suitable pH. For example, the pH of the solution can be increased to a pH of about 10 or more, e.g., a pH of about 10.5 or more, a pH of about 11 or more, or a pH of about 12 or more. Typically, the solution will have a pH of about 14 or less, e.g., a pH of about 13.5 or less, or a pH of about 13 or less. Any suitable base can be used to increase the pH of the solution. Suitable bases include, for example, KOH, NaOH, $NH_4OH$, and tetramethylammonium hydroxide. Organic bases such as, for example, ethanolamine and diethanolamine, also are suitable. The solution will become white and cloudy as the pH increases and amorphous $Ce(OH)_3$ is formed.

The ceria precursor solution typically is mixed for several hours. For example, the solution can be mixed for about 1 hour or more, e.g., about 2 hours or more, about 4 hours or more, about 6 hours or more, about 8 hours or more, about 12 hours or more, about 16 hours or more, about 20 hours or more, or about 24 hours or more. Typically, the solution is mixed for about 1 hour to about 24 hours, e.g., about 2 hours, about 8 hours, or about 12 hours. When mixing is complete, the solution can be transferred to a pressurized vessel and heated.

The ceria precursor solution can be heated to any suitable temperature. For example, the solution can be heated to a temperature of about 50° C. or more, e.g., about 75° C. or more, about 100° C. or more, about 125° C. or more, about 150° C. or more, about 175° C. or more, or about 200° C. or more. Alternatively, or in addition, the solution can be heated to a temperature of about 500° C. or less, e.g., about 450° C. or less, about 400° C. or less, about 375° C. or less, about 350° C. or less, about 300° C. or less, about 250° C. or less, about 225° C., or about 200° C. or less. Thus, the solution can be heated to a temperature within a range bounded by any two of the aforementioned endpoints. For example, the solution can be heated to a temperature of about 50° C. to about 300° C., e.g., about 50° C. to about 275° C., about 50° C. to about 250° C., about 50° C. to about 200° C., about 75° C. to about 300° C., about 75° C. to about 250° C., about 75° C. to about 200° C., about 100° C. to about 300° C., about 100° C. to about 250° C., or about 100° C. to about 225° C.

The ceria precursor solution typically is heated for several hours. For example, the solution can be heated for about 1 hour or more, e.g., about 5 hours or more, about 10 hours or more, about 25 hours or more, about 50 hours or more, about 75 hours or more, about 100 hours or more, or about 110 hours or more. Alternatively, or in addition, the solution can be heated for about 200 hours or less, e.g., about 180 hours or less, about 165 hours or less, about 150 hours or less, about 125 hours or less, about 115 hours or less, or about 100 hours or less. Thus, the solution can be heated for a time period bounded by any two of the aforementioned endpoints. For example, the solution can be heated for about 1 hour to about 150 hours, e.g., about 5 hours to about 130 hours, about 10 hours to about 120 hours, about 15 hours to about 115 hours, or about 25 hours to about 100 hours.

After heating, the ceria precursor solution can be filtered to separate the precipitated ceria particles. The precipitant can be rinsed with excess water to remove unreacted ceria precursor. The mixture of precipitant and excess water can be filtered following each rinse step to remove impurities. Once adequately rinsed, the ceria particles can be dried for additional processing, e.g., sintering, or the ceria particles can be directly redispersed.

The ceria particles optionally can be dried and sintered prior to redispersion. The terms "sintering" and "calcining" are used interchangeably herein to refer to the heating of the ceria particles under the conditions described below. Sintering the ceria particles impacts their resulting crystallinity. Without wishing to be bound by any particular theory, it is believed that sintering the ceria particles at high temperatures and for extended periods of time reduces defects in the crystal lattice structure of the particles. Any suitable method can be used to sinter the ceria particles. As an example, the ceria particles can be dried, and then can be sintered at an elevated temperature. Drying can be carried out at room temperature, or at an elevated temperature. In particular, drying can be carried out at a temperature of about 20° C. to about 40° C., e.g., about 25° C., about 30° C., or about 35° C. Alternatively, or in addition, drying can be carried out at an elevated temperature of about 80° C. to about 150° C., e.g., about 85° C., about 100° C., about 115° C., about 125° C., or about 140° C. After the ceria particles have been dried, they can be ground to create a powder. Grinding can be carried out using any suitable grinding material, such as zirconia.

The ceria particles can be sintered in any suitable oven, and at any suitable temperature. For example, the ceria particles can be sintered at a temperature of about 200° C. or more, e.g., about 215° C. or about 225° C. or more, about 250° C. or more, about 275° C. or more, about 300° C. or more, about 350° C. or more, or about 375° C. or more. Alternatively, or in addition, the ceria particles can be sintered at a temperature of about 1000° C. or less, e.g., about 900° C. or less, about 750° C. or less, about 650° C. or less, about 550° C. or less, about 500° C. or less, about 450° C. or less, or about 400° C. or less. Thus, the ceria particles can be sintered at a temperature bounded by any two of the aforementioned endpoints. For example, the ceria particles can be sintered at a temperature of about 200° C. to about 1000° C., e.g., about 250° C. to about 800° C., about 300° C. to about 700° C., about 325° C. to about 650° C., about 350° C. to about 600° C., about 350° C. to about 550° C., about 400° C. to about 550° C., about 450° C. to about 800° C., about 500° C. to about 1000° C., or about 500° C. to about 800° C.

The ceria particles can be sintered for any suitable length of time. For example, the ceria particles can be sintered for about 1 hour or more, e.g., about 2 hours or more, about 5 hours or more, or about 8 hours or more. Alternatively, or in addition, the ceria particles can be sintered for about 20 hours or less, e.g., about 18 hours or less, about 15 hours or less, about 12 hours or less, or about 10 hours or less. Thus, the ceria particles can be sintered for a time period bounded by any two of the aforementioned endpoints. For example, the ceria particles can be sintered for about 1 hour to about 20 hours, e.g., about 1 hour to about 15 hours, about 1 hour to about 10 hours, about 1 hour to about 5 hours, about 5 hours to about 20 hours, or about 10 hours to about 20 hours.

The ceria particles also can be sintered at various temperatures and for various lengths of time within the ranges described above. For example, the ceria particles can be sintered in a zone furnace, which exposes the ceria particles to one or more temperatures for various lengths of time. As an example, the ceria particles can be sintered at a temperature of about 200° C. to about 1000° C. for about 1 hour or more, and then can be sintered at a different temperature that is within the range of about 200° C. to about 1000° C. for about 1 hour or more.

The ceria particles typically are redispersed in a suitable carrier, e.g., an aqueous carrier, particularly water. If the ceria particles are sintered, then the ceria particles are redispersed after the completion of sintering. Any suitable process can be used to redisperse the ceria particles. Typically, the ceria particles are redispersed by lowering the pH of a mixture of the ceria particles and water using a suitable acid. As the pH is lowered, the surface of the ceria particles develops a cationic zeta potential. This cationic zeta potential creates repulsion forces between the ceria particles, which facilitates their redispersion. Any suitable acid can be used to lower the pH of the mixture. Suitable acids include, for example hydrochloric acid and nitric acid. Organic acids which are highly water-soluble and have hydrophilic functional groups also are suitable. Suitable organic acids include, for example, acetic acid. Acids with multivalent anions, such as $H_3PO_4$ and $H_2SO_4$, generally are not preferred. The pH of the mixture can be lowered to any suitable pH. For example, the pH of the mixture can be lowered to about 2 to about 5, e.g., about 2.5, about 3, about 3.5, about 4, or about 4.5. Typically, the pH of the mixture is not lowered to less than about 2.

The redispersed ceria particles typically are milled to reduce their particle size. Preferably, the ceria particles are milled simultaneously with redispersion. Milling can be carried out using any suitable milling material, such as zirconia. Milling also can be carried out using sonication or wet-jet procedures. After milling, the ceria particles can be filtered to remove any remaining large particles. For example, the ceria particles can be filtered using a filter having a pore size of about 0.3 μm or more, e.g., about 0.4 μm or more, or about 0.5 μm or more.

The abrasive particles (e.g., ceria abrasive particles) preferably have a median particle size of about 40 nm to about 100 nm. The particle size of a particle is the diameter of the smallest sphere that encompasses the particle. The particle size of the abrasive particles can be measured using any suitable technique. For example, the particle size of the abrasive particles can be measured using a disc centrifuge, i.e., by differential centrifugal sedimentation (DCS). Suitable disc centrifuge particle size measurement instruments are commercially available, such as from CPS Instruments (Prairieville, La.), e.g., CPS Disc Centrifuge Model DC24000UHR. Unless specified otherwise, the median particle size values reported and claimed herein are based on disc centrifuge measurements.

By way of example, the abrasive particles (e.g., ceria abrasive particles) can have a median particle size of about 40 nm or more, e.g., about 45 nm or more, about 50 nm or more, about 55 nm or more, about 60 nm or more, about 65 nm or more, about 70 nm or more, about 75 nm or more, or about 80 nm or more. Alternatively, or in addition, the abrasive particles can have a median particle size of about 100 nm or less, e.g., about 95 nm or less, about 90 nm or less, about 85 nm or less, about 80 nm or less, about 75 nm or less, about 70 nm or less, or about 65 nm or less. Thus, the abrasive particles can have a median particle size within a range bounded by any two of the aforementioned endpoints. For example, the abrasive particles can have a median particle size of about 40 nm to about 100 nm, e.g., about 40 nm to about 80 nm, about 40 nm to about 75 nm, about 40 nm to about 60 nm, about 50 nm to about 100 nm, about 50 nm to about 80 nm, about 50 nm to about 75 nm, about 50 nm to about 70 nm, about 60 nm to about 100 nm, about 60 nm to about 80 nm, about 60 nm to about 85 nm, or about 65 nm to about 75 nm. Preferably, the abrasive particles have a median particle size of about 60 nm to about 80 nm, e.g., a median particle size of about 65 nm, a median particle size of about 70 nm, or a median particle size of about 75 nm.

The chemical-mechanical polishing composition can comprise any suitable amount of abrasive. If the composition comprises too little abrasive, the composition may not exhibit sufficient removal rate. In contrast, if the polishing composition comprises too much abrasive, the composition may exhibit undesirable polishing performance, may not be cost effective, and/or may lack stability. Accordingly, the abrasive can be present in the polishing composition at a concentration of about 5 wt. % or less, for example, about 4 wt. % or less, about 3 wt. % or less, about 2 wt. % or less, or about 1 wt. % or less. Alternatively, or in addition, the abrasive can be present in the polishing composition at a concentration of about 0.001 wt. % or more, for example, about 0.005 wt. % or more, about 0.01 wt. % or more, about 0.05 wt. % or more, about 0.1 wt. % or more, or about 0.5 wt. % or more. Thus, the abrasive can be present in the polishing composition at a concentration bounded by any two of the aforementioned endpoints. For example, the abrasive can be present in the polishing composition at a concentration of about 0.001 wt. % to about 5 wt. %, e.g., about 0.005 wt. % to about 4 wt. %, about 0.01 wt. % to about 3 wt. %, about 0.05 wt. % to about 2 wt. %, or about 0.1 wt. % to about 1 wt. %.

Typically, the polishing composition does not comprise a substantial amount of an abrasive suitable for polishing metals (e.g., copper, silver, tungsten, etc.) on the surface of a substrate. For example, the polishing composition typically does not comprise a substantial amount of certain metal oxides (e.g., alumina) suitable for polishing a metal surface. Typically, the polishing composition comprises less than 0.1 wt. % of an abrasive other than ceria abrasive and zirconia abrasive, based on the total weight of abrasive in the polishing composition. For example, the polishing composition can comprise 0.05 wt. % or less of an abrasive other than a ceria abrasive and a zirconia abrasive, or 0.01 wt. % or less of an abrasive other than a ceria abrasive and a zirconia abrasive. More specifically, the polishing composition can comprise 0.05 wt. % or less of a metal oxide other than ceria and zirconia, or 0.01 wt. % or less of a metal oxide other than ceria and zirconia.

The abrasive desirably is suspended in the polishing composition, more specifically in the aqueous carrier of the polishing composition. More specifically, when the abrasive includes particles, the abrasive particles desirably are suspended in the polishing composition, and the abrasive particles preferably are colloidally stable. The term colloid refers to the suspension of abrasive particles in the aqueous carrier. Colloidal stability refers to the maintenance of that suspension over time. In the context of this invention, abrasive particles are considered colloidally stable if, when the abrasive particles are placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). The value of [B]-[T]/[C] desirably is less than or equal to 0.3, and preferably is less than or equal to 0.1.

The inventive polishing composition comprises a self-stopping agent. The self-stopping agent is a compound that facilitates a relatively high pattern removal rate and a relatively low blanket removal rate, and upon planarizing during polishing, facilitates transitioning from a high pattern removal rate to a relatively low blanket removal rate. Without wishing to be bound to any particular theory, it is believed that the self-stopping agent acts as a ligand that attaches to the abrasive (e.g., to ceria or to zirconia) to facilitate self-stopping behavior by providing steric hindrance between the abrasive and the hydrophilic oxide surface. The binding of the self-stopping agent to the abrasive can be evaluated using any suitable technique, e.g., isothermal titration calorimetry (ITC).

Without wishing to be bound by any particular theory, it is believed that the self-stopping agent facilitates a non-linear response to a given down force (DF) on tetraethoxysilane (TEOS) blanket dielectric materials. During polishing, pattern dielectric material experiences an effective downforce (DF) higher than that of blanket dielectric material, because contact is spread over only some portions of the pattern dielectric material which are making contact with the pad. A higher effective DF applied to a TEOS pattern dielectric material results in a "high" removal rate (e.g., pattern removal rate) polishing regime having a TEOS removal rate of about 8,000 Å/min, wherein a lower effective DF results in a "stopping" polishing regime having a TEOS removal rate of about 1,000 Å/min or less (e.g., blanket removal rate). The difference between the "high" regime and the "stopping" regime typically is distinct such that for a given DF either a "high" removal rate, or a "stopping" removal rate is observed. Accordingly, it is believed that the self-stopping agent desirably enables a "high" removal rate (i.e., a pattern removal rate) even when the applied DF is in the "stopping" regime as determined with blanket wafers.

Moreover, it also noted that the mechanism is not solely dependent on DF since the trench oxide removal rate on pattern dielectric material is higher than the blanket removal rate despite having a lower effective DF in the trenches than on the blanket wafers. For example, in some polishing applications, the concentration of the self-stopping agent plays a role in the observed effect since at low concentrations, the self-stopping agent can act as a rate enhancer (e.g., a "high" removal rate is observed) and at higher concentrations the self-stopping behavior is observed (e.g., a "stopping" removal rate is observed). Accordingly, some rate enhancers can have dual action. By way of example, when a polishing composition comprises picolinic acid in lower concentrations, the picolinic acid can function as a rate enhancer. However, when the polishing composition comprises picolinic acid in higher concentrations, the picolinic acid can function as a self-stopping agent. Typically, picolinic acid functions as a rate enhancer at concentrations less than about 1000 ppm, on a weight basis (e.g., about 500 ppm, about 250 ppm, etc).

In some embodiments of the invention, the self-stopping agent is of the formula Q-B, wherein Q is a substituted or unsubstituted hydrophobic group, or a group imparting a steric hindrance, and B is a binding group, such as, —C(O)—C—OH, —C(O)—C—C—OH or —C(O)—OH. For example, in some embodiments the invention provides a polishing composition comprising an abrasive, a self-stopping agent of the formula Q-B, a cationic compound, and an aqueous carrier (e.g., water), wherein the polishing composition has a pH of about 3 to about 9 (e.g., about 6.5 to about 8.5).

In some embodiments of the invention, the self-stopping agent is of the formula Q-B, wherein Q is a substituted or unsubstituted hydrophobic group, or a group imparting a steric hindrance, and B is a binding group, wherein the binding group has the structure: —C(O)—X—OH or —C(O)—OH. Wherein X is a C1-C2 alkyl group. When the self-stopping agent is a compound of the formula Q-B as described herein, Q can be any suitable hydrophobic group, or any suitable group imparting steric hindrance. Suitable hydrophobic groups include saturated and unsaturated hydrophobic groups. The hydrophobic group can be linear or branched, and can include linear or branched alkyl groups, cycloalkyl groups, and ring structures, including aromatic, heterocyclic, and fused ring systems.

In an embodiment, Q is selected from an alkyl group, a cycloalkyl group, an aromatic group, a heterocyclic group, a heteroaromatic group, and combinations thereof.

Q can be an alkyl group. Suitable alkyl groups include, for example, linear or branched, saturated or unsaturated, substituted or unsubstituted hydrocarbon groups having 1 to 30 carbon atoms (e.g., a $C_1$-$C_{30}$ alkyl group, a $C_1$-$C_{24}$ alkyl group, a $C_1$-$C_{18}$ alkyl group, a $C_1$-$C_{12}$ alkyl group, or even a $C_1$-$C_6$ alkyl group), for example, at least 1 carbon atom (i.e., methyl), at least 2 carbon atoms (e.g., ethyl, vinyl), at least 3 carbon atoms (e.g., propyl, isopropyl, propenyl, etc.), at least 4 carbon atoms (butyl, isobutyl, sec-butyl, butane, etc.), at least 5 carbon atoms (pentyl, isopentyl, sec-pentyl, neo-pentyl, etc.), at least 6 carbon atoms (hexyl, etc.), at least 7 carbon atoms, at least 8 carbon atoms, at least 9 carbon atoms, at least 10 carbon atoms, at least 11 carbon atoms, at least 12 carbon atoms, at least 13 carbon atoms, at least 14 carbon atoms, at least 15 carbon atoms, at least 16 carbon atoms, at least 17 carbon atoms, at least 18 carbon atoms, at least 19 carbon atoms, at least 20 carbon atoms, at least 25 carbon atoms, or at least 30 carbon atoms.

A substituted group refers to a group in which one or more carbon-bonded hydrogens is replaced by a non-hydrogen atom. Illustrative substituents include, for example, hydroxyl groups, keto groups, esters, amides, halogens (e.g., fluorine, chlorine, bromine, and iodine), amino groups (primary, secondary, tertiary, and/or quaternary), and combinations thereof.

Q can be a cycloalkyl group. Suitable cycloalkyl groups include, for example, saturated or unsaturated, substituted or unsubstituted cycloalkyl groups having 3 to 20 carbon atoms (e.g., $C_3$-$C_{20}$ cyclic group). For example, suitable cycloalkyl groups include cyclopropyl, cyclobutyl, cyclopentyl, cyclohexyl, cycloheptyl, cyclooctyl, cyclononyl, and combinations thereof. In addition, suitable unsaturated cycloalkyl groups include, for example, cyclobutene, cyclopentene, cyclohexene, and combinations thereof.

Q can be an aromatic group. Suitable aromatic groups include, for example, substituted or unsubstituted aromatic groups having 1 to 20 carbon atoms. For example, suitable aromatic groups include phenyl, benzyl, naphthyl, azulene, anthracene, pyrene, and combinations thereof.

Q can be a heteroaromatic group. A "heteroatom" is defined herein as any atom other than carbon and hydrogen atoms. Suitable heteroatom-containing functional groups include, for example, hydroxyl groups, carboxylic acid groups, ester groups, ketone groups, amino groups (e.g., primary, secondary, and tertiary amino groups), amido groups, imido groups, thiol ester groups, thioether groups, nitrile groups, nitros groups, halogen groups, and combinations thereof.

Suitable heterocyclic groups include, for example, cyclic hydrocarbon compounds containing 1 to 20 carbon atoms and containing nitrogen, oxygen, sulfur, phosphorous, boron, and combinations thereof. The heterocyclic compound can be saturated and unsaturated, substituted or unsubstituted. A heterocyclic compound refers to a 5-, 6-, or 7-membered ring compound having one or more heteroatom atoms (e.g., N, O, S, P, or B)) contained as part of the ring system. Illustrative heterocyclic compounds include, for example, a triazole, aminotriazole, 3-amino-1,2,4-triazole, 3-amino-1,2,4-triazole-5-carboxylic acid, 3-amino-5-mercapto-1,2,4-triazole, 4-amino-5-hydrazino-1,2,4-triazole-3-thiol, thiazole, 2-amino-5-methylthiazole, 2-amino-4-thoazoleacetic acid, a heterocyclic N-oxide, 2-hydroxypyridine-N-oxide, 4-methylmorpholine-N-oxide, and picolinic acid N-oxide, and the like. Other illustrative heterocyclic compounds include, for example, pyrone compounds, pyridine compounds, including regioisomers and stereoisomers, pyrrolidine, delta-2-pyrroline, imidazolidine, delta-2-imidazoline, delta-3-pyrazoline, pyrazolidine, piperidine, piperazine, morpholine, quinuclidine, indoline, isoindoline, chroman, isochromann, and combinations thereof.

Suitable heteroaromatic groups include, for example, pyridine, thiophene, furane, pyrrole, 2H-pyrrole, imidazole, pyrazole, isoxazole, furazan, isothiazole, pyran(2H), pyrazine, pyrimidine, pyridazine, isobenzofuran, indolizine, indole, 3H-indole, 1H-indazole, purine, isoindole, 4aH-carbazole, carbazole, beta-carboline, 2H-chromene, 4H-quinolizine, isoquinoline, quinoline, quinoxalin, 1,8-naphthyridine, phthalazine, quinazoline, cinnoline, pteridine, xanthenes, phenoxathiin, phenothiazine, phenazine, perimidine, 1,7-phenantrholine, phenanthridine, acridine, and combinations thereof.

In some embodiments, Q is substituted with one or more substituents. Suitable substituents can include, for example, any suitable compound/group described herein. For example, suitable substituents include alkyl groups, cycloalkyl groups, aryl groups, heterocyclic groups, heteroaromatic groups, and combinations thereof.

In some embodiments, Q is unsubstituted. In other embodiments, Q is a group that imparts a steric hindrance. For example, Q may not be particularly hydrophobic, but may be a bulky constituent that prevents chemical reactions or interactions that would otherwise occur in related molecules with smaller Q groups. Without limitation, examples of self-stopping agents having such a Q group would be maltol, ethyl maltol and kojic acid.

In some embodiments, the binding group B is selected from a carboxylic acid group, a hydroxamic acid group, a hydroxylamine group, a hydroxyl group, a keto group, a sulfate group, a phosphate group, and combinations thereof.

In some embodiments, the self-stopping agent Q-B is selected from kojic acid, maltol, ethyl maltol, propyl maltol, hydroxamic acid, benzhydroxamic acid, salicylhydroxamic acid, benzoic acid, 3,4-dihydroxybenzoic acid, 3,5-dihydroxybenzoic acid, caffeic acid, sorbic acid, and combinations thereof.

In addition, the salts of the self-stopping agents of the formulation Q-B also are suitable for use in the inventive polishing compositions.

In some embodiments, the self-stopping agent is selected from kojic acid, maltol, ethyl maltol, propyl maltol, tiglic acid, angelic acid, benzoic acid, 3,4-dihydroxybenzoic acid, 3,5-dihydroxybenzoic acid, caffeic acid, sorbic acid, potassium sorbate, and combinations thereof.

In some embodiments, the self-stopping agent of the formulation Q-B is selected from a compound of formula (I), a compound of formula (II), a compound of formula (III), a compound of formula (IV) and combinations thereof.

A compound of formula (I) has the following structure:

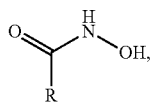
(I)

wherein R is selected from the group consisting of hydrogen, alkyl, cycloalkyl, aryl, heterocyclic alkyl, and heterocyclic aryl, each of which may be substituted or unsubstituted.

A compound of formula (II) has the following structure:

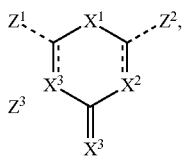
(II)

wherein each of $X^1$-$X^3$ is independently selected from N, O, S, a $sp^2$ hybridized carbon, and $CY^1Y^2$, wherein each of $Y^1$ and $Y^2$ is independently selected from hydrogen, hydroxyl, $C_1$-$C_6$ alkyl, halogen, and combinations thereof, and each of $Z^1$-$Z^3$ is independently selected from hydrogen, hydroxyl, $C_1$-$C_6$ alkyl, and combinations thereof, each of which may be substituted or unsubstituted.

A compound of formula (III) has the following structure:

$$Z-(C(X^1X^2)_n)_p-CO_2M \quad (III),$$

wherein Z is selected from N, $C_1$-$C_6$ alkyl, $C_1$-$C_6$ alkenyl, $C_1$-$C_6$ alkynyl, and aryl (e.g., phenyl, benzyl, naphthyl, azulene, anthracene, pyrene, etc.), $X^1$ and $X^2$ are independently selected from hydrogen, hydroxy, amino, and $C_1$-$C_6$ alkyl, $C_1$-$C_6$ alkenyl; and wherein $X^1$ and $X^2$ taken together with the attached carbon can form a $sp^2$-hybridized carbon, n is 1 or 2, p is 0-4, and M is selected from hydrogen and a suitable counterion (e.g., a group I metal), each of which may be substituted or unsubstituted.

A compound of formula (IV) has the following structure:

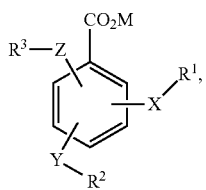
(IV)

where X, Y, and Z are independently selected from H, O, S, NH, and $CH_2$, $R^1$, $R^2$ and $R^3$ are independently selected from H, alkyl, alkenyl, alkynyl, aryl, halo, and haloalkyl, and M is selected from hydrogen and a suitable counterion.

The polishing composition can comprise any suitable amount of the self-stopping agent (e.g., a compound of formula Q-B). If the composition comprises too little self-stopping agent, then the composition may not exhibit suitable self-stopping behavior. In contrast, if the polishing composition comprises too much self-stopping agent, the composition may exhibit undesirable polishing performance, may not be cost effective, and/or may lack stability. Accordingly, the polishing composition can comprise about 2 wt. % or less of the self-stopping agent, for example, about 1 wt. % or less, about 0.5 wt. % or less, about 0.1 wt. % or less, or about 0.01 wt. % or less. Alternatively, or in addition, the polishing composition can comprise about 0.0001 wt. % or more of the self-stopping agent, for example, about 0.0005 wt. % or more, about 0.001 wt. % or more, about 0.005 wt. % or more, about 0.01 wt. % or more, or about 0.05 wt. % or more. Thus, the polishing composition can comprise the self-stopping agent at a concentration bounded by any two of the aforementioned endpoints. For example, the self-stopping agent can be present in the polishing composition at a concentration of about 0.0001 wt. % to about 2 wt. %, e.g., about 0.0005 wt. % to about 1 wt. %, about 0.001 wt. % to about 0.5 wt. %, about 0.005 wt. % to about 0.1 wt. %, or about 0.01 wt. % to about 0.05 wt. %.

In some embodiments, the inventive polishing composition comprises about 0.5 wt. % or less (e.g., about 5,000 ppm or less) of the self-stopping agent. In some embodiments, the polishing composition comprises about 2,500 ppm (0.25 wt. %) or less of the self-stopping agent, e.g., about 2,000 ppm or less, about 1,500 ppm or less, about 1,000 ppm or less, or about 500 ppm or less.

In some embodiments, the inventive polishing composition comprises a self-stopping agent in combination with a planarizing agent (i.e., cationic compound), also referred to as a topography control agent. Without wishing to be bound by any particular theory, it is believed that the cationic compound acts as a planarizing agent to improve the topography of the polished substrate since the cationic compound typically lowers oxide removal rate by binding to the negatively charged oxide surface. The cationic compound also improves the planarization efficiency of the self-stopping composition under polishing conditions of higher pH (e.g., having a pH of about 6.5 to about 8.5, having a pH of about 7.0 to 8.5).

The cationic compound may be a polymer that comprises monomers selected from quaternary amines, cationic polyvinyl alcohols, cationic cellulose, and combinations thereof. Accordingly, the cationic polymer can comprise a quaternary amine, a cationic polyvinyl alcohol, a cationic cellulose, and combinations thereof.

Suitable quaternary amine monomers include, for example, vinylimidazolium, methacryloyloxyethyltrimethylammonium halide, diallyldimethylammonium halide, and combinations thereof. Thus, suitable cationic polymers include, for example, a quaternary amine selected from poly(vinylimidazolium), a poly(methacryloyloxyethyltrimethylammonium) halide such as poly(methacryloyloxyethyltrimethylammonium) chloride (polyMADQUAT), a poly(diallyldimethylammonium) halide such as poly(diallyldimethylammonium) chloride (polyDADMAC), poly[bis(2-chloroethyl) ether-alt-1,3-bis[3-(dimethylamino)propyl]urea] (i.e. Polyquaternium-2), copolymers of vinylpyrrolidone and quaternized dimethylaminoethyl methacrylate (i.e. Polyquaternium-11), copolymers of vinylpyrrolidone and quaternized vinylimidazole (i.e. Polyquaternium-16), a terpolymer of vinylcaprolactam, vinylpyrrolidone, and quaternized vinylimidazole (i.e. Polyquaternium-46), and 3-Methyl-1-vinylimidazolium methyl sulfate-N-vinylpyrrolidone copolymer (i.e. Polyquaternium-44). Additionally, suitable cationic polymers include cationic polymers for personal care such as Luviquat® Supreme, Luviquat® Hold, Luviquat® UltraCare, Luviquat® FC 370, Luviquat® FC 550, Luviquat® FC 552, Luviquat® Excellence, and combinations thereof. Any combination of the cationic polymers mentioned here may be used.

In an embodiment, the cationic polymer is a quaternary amine, and the cationic polymer is a poly(methacryloyloxyethyltrimethylammonium) halide, for example, polyMADQUAT.

In an embodiment, the cationic polymer is a quaternary amine, and the cationic polymer is poly(vinylimidazolium).

The cationic polymer can be any suitable cationic polyvinyl alcohol or cationic cellulose. Preferably, the cationic polymer is a cationic polyvinyl alcohol. For example, the cationic polyvinyl alcohol can be the Nippon Gosei GOHSEFIMER K210™ polyvinyl alcohol product.

The cationic polymer (i.e., the quaternary amine, the cationic polyvinyl alcohol, the cationic cellulose, or a combination thereof, in total), when present, can be present in the polishing composition at any suitable concentration. Typically, the cationic polymer is present in the polishing composition at a concentration of about 1 ppm to about 500 ppm, e.g., about 1 ppm to about 475 ppm, about 1 ppm to about 450 ppm, about 1 ppm to about 425 ppm, about 1 ppm to about 400 ppm, about 1 ppm to about 375 ppm, about 1 ppm to about 350 ppm, about 1 ppm to about 325 ppm, about 1 ppm to about 300 ppm, about 1 ppm to about 275 ppm, about 1 ppm to about 250 ppm, about 1 ppm to about 225 ppm, about 1 ppm to about 200 ppm, about 1 ppm to about 175 ppm, about 1 ppm to about 150 ppm, about 1 ppm to about 125 ppm, about 1 ppm to about 100 ppm, about 1 ppm to about 75 ppm, about 1 ppm to about 50 ppm, about 1 ppm to about 40 ppm, about 1 ppm to about 25 ppm, about 5 ppm to about 225 ppm, about 5 ppm to about 100 ppm, about 5 ppm to about 50 ppm, about 10 ppm to about 215 ppm, about 10 ppm to about 100 ppm, about 15 ppm to about 200 ppm, about 25 ppm to about 175 ppm, about 25 ppm to about 100 ppm, or about 30 ppm to about 150 ppm. Unless otherwise stated, the ppm concentrations listed herein reflect a weight based ratio of the component to the total weight of the polishing composition.

When the cationic polymer is poly(vinylimidazolium), the cationic polymer preferably is present in the polishing composition at a concentration of about 1 ppm to about 10 ppm, e.g., about 2 ppm, about 5 ppm, about 6 ppm, about 7 ppm, about 8 ppm, or about 9 ppm. More preferably, when the cationic polymer is poly(vinylimidazolium), the cationic polymer preferably is present in the polishing composition at a concentration of about 1 ppm to about 5 ppm, e.g., about 2 ppm, about 3 ppm, or about 4 ppm.

The polishing composition can optionally comprise an additive selected from an anionic copolymer of a carboxylic acid monomer, a sulfonated monomer, or a phosphonated monomer, and an acrylate, a polyvinylpyrrolidone, or a polyvinylalcohol (e.g., a copolymer of 2-hydroxyethylmethacrylic acid and methacrylic acid); a nonionic polymer, wherein the nonionic polymer is polyvinylpyrrolidone or polyethylene glycol; a silane, wherein the silane is an amino silane, an ureido silane, or a glycidyl silane; an N-oxide of a functionalized pyridine (e.g., picolinic acid N-oxide); a starch; a cyclodextrin (e.g., alpha-cyclodextrin or beta-cyclodextrin), and combinations thereof.

When the additive is a nonionic polymer, and when the nonionic polymer is polyvinylpyrrolidone, the polyvinylpyrrolidone can have any suitable molecular weight. For example, the polyvinylpyrrolidone can have a molecular weight of about 10,000 g/mol to about 1,000,000 g/mol, e.g., about 20,000 g/mol, about 30,000 g/mol, about 40,000 g/mol, about 50,000 g/mol, or about 60,000 g/mol. When the additive is a nonionic polymer, and when the nonionic polymer is polyethylene glycol, the polyethylene glycol can have any suitable molecular weight. For example, the polyethylene glycol can have a molecular weight of about 200 g/mol to about 200,000 g/mol, e.g., about 8000 g/mol, or about 100,000 g/mol.

When the additive is a silane, the silane can be any suitable amino silane, ureido silane, or glycidyl silane. For example, the silane can be 3-aminopropyltrimethoxysilane, 3-aminopropylsilanetriol, N-(2-aminoethyl)-3-aminopropyltrimethoxysilane, N-(2-aminoethyl)-3-aminopropyltrimethoxysilanetriol, (N,N)-dimethyl-3-aminopropyltrimethoxysilane, N-phenyl-3-aminopropyltrimethoxysilane, ureidopropyltriethoxysilane, or 3-glycidopropyldimethylethoxysilane.

Preferably, when the polishing composition comprises an additive, the additive is selected from a copolymer of 2-hydroxyethylmethacrylic acid and methacrylic acid, polyvinylpyrrolidone, aminopropylsilanetriol, picolinic acid N-oxide, starch, alpha-cyclodextrin, beta-cyclodextrin, and combinations thereof.

The additive (i.e., the anionic copolymer of a carboxylic acid monomer, a sulfonated monomer, or a phosphonated monomer, and an acrylate, a polyvinylpyrrolidone, or a polyvinylalcohol; the silane; the N-oxide of a functionalized pyridine; the starch; the cyclodextrin; or a combination thereof, in total) can be present in the chemical-mechanical polishing composition at any suitable concentration. Preferably, the additive is present in the polishing composition at a concentration of about 1 ppm to about 500 ppm, e.g., about 5 ppm to about 400 ppm, about 10 ppm to about 400 ppm, about 15 ppm to about 400 ppm, about 20 ppm to about 400 ppm, about 25 ppm to about 400 ppm, about 10 ppm to about 300 ppm, about 10 ppm to about 250 ppm, about 30 ppm to about 350 ppm, about 30 ppm to about 275 ppm, about 50 ppm to about 350 ppm, or about 100 ppm to about 300 ppm. More preferably, the additive is present in the polishing composition at a concentration of about 1 ppm to about 300 ppm, e.g., about 1 ppm to about 275 ppm, about 1 ppm to about 250 ppm, about 1 ppm to about 100 ppm, about 1 ppm to about 50 ppm, about 10 ppm to about 250 ppm, about 10 ppm to about 100 ppm, or about 35 ppm to about 250 ppm.

The polishing composition optionally can comprise a cationic polymer as described herein, in addition to one or more of the additives described herein, i.e., one or more of an anionic copolymer of a carboxylic acid monomer, a sulfonated monomer, or a phosphonated monomer, and an acrylate, a polyvinylpyrrolidone, or a polyvinylalcohol; a nonionic polymer; a silane; an N-oxide of a functionalized pyridine; a starch; and a cyclodextrin. Alternatively, the polishing composition can comprise a cationic polymer without one or more of the additives described above, i.e., without one or more of an anionic copolymer of a carboxylic acid monomer, a sulfonated monomer, or a phosphonated monomer, and an acrylate, a polyvinylpyrrolidone, or a polyvinylalcohol; a nonionic polymer; a silane; an N-oxide of a functionalized pyridine; a starch; and a cyclodextrin.

The polishing composition comprises an aqueous carrier. The aqueous carrier comprises water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The inventive polishing composition has a pH of about 3 to about 9. Typically, the polishing composition has a pH of about 3 or greater. Also, the pH of the polishing composition typically is about 9 or less. For example, the polishing composition can have a pH of about 3.5 to about 9, e.g., about 4 to about 9, about 4.5 to about 9, about 5 to about 9, about 5.5 to about 9, about 6 to about 9, about 6.5 to about 9, about 7 to about 9, about 7.5 to about 9, about 8 to about 9, or about 8.5 to about 9. Alternatively, the polishing composition can have a pH of about 3 to about 8.5, e.g., about 3 to about 8, about 3 to about 7.5, about 3 to about 7, about 3 to about 6.5, about 3 to about 6, about 3 to about 5.5, about 3 to about 5, about 3 to about 4.5, about 3 to about 4, or about 3 to about 3.5. Thus, the polishing composition can have a pH bounded by any two of the aforementioned endpoints.

Preferably, the polishing composition has a pH of about 3 to about 5, or of about 7.0 to about 8.5. For example, in a preferred embodiment the polishing composition comprises an abrasive, a self-stopping agent of the formula Q-B as described herein, and an aqueous carrier, wherein the pH of the polishing composition is about 3 to about 5.

In another preferred embodiment, the polishing composition comprises an abrasive, a self-stopping agent of the formula Q-B as described herein, a cationic polymer, and an aqueous carrier, wherein the pH of the polishing composition is about 7.0 to about 9.0. In some preferred embodiments, the inventive polishing composition comprises an abrasive, a self-stopping agent of the formula (I) as described herein, a cationic polymer, and an aqueous carrier, wherein the pH of the polishing composition is about 7.0 to about 9.0.

The polishing composition can comprise a pH-adjusting agent and a pH buffering agent. The pH-adjusting agent can be any suitable pH-adjusting agent. For example, the pH-adjusting agent can be an alkyl amine, an alcohol amine, quaternary amine hydroxide, ammonia, or a combination thereof. In particular, the pH-adjusting agent can be triethanolamine (TEA), tetramethylammonium hydroxide (TMAH or TMA-OH), or tetraethylammonium hydroxide (TEAH or TEA-OH). In some embodiments, the pH-adjusting agent is triethanolamine.

The pH-adjusting agent can be present in the polishing composition in any suitable concentration. Desirably, the pH-adjusting agent is present in the polishing composition at a sufficient concentration to achieve and/or maintain the pH of the polishing composition within the pH ranges set forth herein, e.g., to maintain a pH of about 3 to about 9, to maintain a pH of about 3 to about 5, or to maintain a pH of about 7.0 to about 8.5.

The polishing composition can contain any suitable buffering agent. For example, suitable buffering agents may include phosphates, sulfates, acetates, malonates, oxalates, borates, ammonium salts, azoles and the like. In some embodiments, the buffering agent is 1H-benzotriazole.

The polishing composition may contain any suitable amount of the buffering agent, when present. For example, the buffering agent can be present in the polishing composition at a concentration of about 0.0001 wt. % or more, e.g., about 0.0005 wt. % or more, about 0.001 wt. % or more, about 0.005 wt. % or more, about 0.01 wt. % or more, or about 0.1 wt. % or more. Alternatively, or in addition, the buffering agent can be present in the polishing composition at a concentration of about 2 wt. % or less, e.g., about 1.8 wt. % or less, about 1.6 wt. % or less, about 1.4 wt. % or less, about 1.2 wt. % or less, or about 1 wt. % or less. Thus, the buffering agent can be present in the polishing composition at a concentration bounded by any two of aforementioned endpoints. For example, the buffering agent can be present in the polishing composition at a concentration of about 0.0001 wt. % to about 2 wt. %, e.g., about 0.005 wt. % to about 1.8 wt. %, about 0.01 wt. % to about 1.6 wt. %, or about 0.1 wt. % to about 1 wt. %.

The polishing composition optionally further comprises one or more other additional components. Illustrative additional components include rate enhancers, conditioners, scale inhibitors, dispersants, etc. A rate enhancer desirably is an organic carboxylic acid that activates the polishing particle or substrate by forming hypercoordinate compounds (e.g., pentacoordinate or hexacoordinate silicon compounds). Suitable rate enhancers include, for example, picolinic acid and 4-hydroxybenzoic acid. The polishing composition can comprise a surfactant and/or rheological control agent, including viscosity enhancing agents and coagulants (e.g., polymeric rheological control agents, such as, for example, urethane polymers), a dispersant, a biocide (e.g., KATHON™ LX), and the like. Suitable surfactants include, for example, cationic surfactants, anionic surfactants, anionic polyelectrolytes, nonionic surfactants, amphoteric surfactants, fluorinated surfactants, mixtures thereof, and the like. By way of example, additional components may include Brij S20 (polyethylene glycol octadecyl ether) and polyethylene glycol (e.g. PEG8000).

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., abrasive, self-stopping agent, cationic compound, etc.) as well as any combination of ingredients (e.g., abrasive, self-stopping agent, cationic compound, etc.).

For example, the self-stopping agent can be added to the aqueous carrier (e.g., water) at the desired concentration(s). The pH can then be adjusted (as desired) and the abrasive can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise an abrasive, a self-stopping agent, a cationic polymer (if present), and aqueous carrier, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high-pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of chemically-mechanically polishing a substrate using the inventive CMP composition described herein. In an embodiment, the invention provides a method of chemically-mechanically polishing a substrate comprising (i) providing a substrate, wherein the substrate comprises a pattern dielectric layer on a surface of the substrate, wherein the pattern dielectric layer comprises a raised area of dielectric material and a trench area of dielectric material, and wherein the initial step height of the pattern dielectric layer is the difference between the height of the raised area of dielectric material and the height of the trench area of dielectric material, (ii) providing a polishing pad, (iii) providing the chemical-mechanical polishing composition described herein, (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

More specifically, the invention provides a method of chemically-mechanically polishing a substrate comprising (i) providing a substrate, wherein the substrate comprises a pattern dielectric layer on a surface of the substrate, wherein the pattern dielectric layer comprises a raised area of dielectric material and a trench area of dielectric material, and wherein the initial step height of the pattern dielectric layer is the difference between the height of the raised area of dielectric material and the height of the trench area of dielectric material, (ii) providing a polishing pad, (iii) providing a chemical-mechanical polishing composition comprising (a) an abrasive, (b) a self-stopping agent of the formula Q-B, wherein Q is a substituted or unsubstituted hydrophobic group, or a group imparting a steric hindrance, B is a binding group, wherein the binding group has the structure, C(O)—X—OH or —C(O)—OH, wherein X is a C1-C2 alkyl group; (c) an aqueous carrier, (d) optionally, a cationic polymer, wherein the polishing composition has a pH of about 3 to about 9, (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

The invention also provides a method of chemically-mechanically polishing a substrate comprising (i) providing a substrate, wherein the substrate comprises a pattern dielectric layer on a surface of the substrate, wherein the pattern dielectric layer comprises a raised area of dielectric material and a trench area of dielectric material, and wherein the initial step height of the pattern dielectric layer is the difference between the height of the raised area of dielectric material and the height of the trench area of dielectric material, (ii) providing a polishing pad, (iii) providing a chemical-mechanical polishing composition comprising (a) an abrasive comprising ceria, (b) a self-stopping agent selected from kojic acid, maltol, caffeic acid, crotonic acid, tiglic acid, 2-pentenoic acid, 2-hydroxynicotinic acid, ethyl maltol, potassium sorbate, sorbic acid, deferiprone, valeric acid and combinations thereof, and (c) an aqueous carrier, wherein the polishing composition has a pH of about 3 to about 9, (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

The invention also provides a method of chemically-mechanically polishing a substrate comprising (i) providing a substrate, wherein the substrate comprises a pattern dielectric layer on a surface of the substrate, wherein the pattern dielectric layer comprises a raised area of dielectric material and a trench area of dielectric material, and wherein the initial step height of the pattern dielectric layer is the difference between the height of the raised area of dielectric material and the height of the trench area of dielectric material, (ii) providing a polishing pad, (iii) providing a chemical-mechanical polishing composition comprising (a) an abrasive, (b) a self-stopping agent selected from a compound of formula (I),

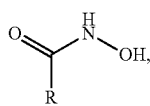
(I)

wherein R is selected from the group consisting of hydrogen, alkyl, cycloalkyl, aryl, heterocyclic alkyl, and heterocyclic aryl, each of which may be substituted or unsubstituted, (c) an aqueous carrier, (d) a cationic polymer, wherein the polishing composition has a pH of about 7 to about 9, (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

The invention also provides a method of chemically-mechanically polishing a substrate comprising (i) providing a substrate, wherein the substrate comprises a pattern dielectric layer on a surface of the substrate, wherein the pattern dielectric layer comprises a raised area of dielectric material and a trench area of dielectric material, and wherein the initial step height of the pattern dielectric layer is the difference between the height of the raised area of dielectric material and the height of the trench area of dielectric material, (ii) providing a polishing pad, (iii) providing a chemical-mechanical polishing composition comprising (a) an abrasive, (b) a self-stopping agent selected from a compound of formula (II), (III) or (IV), wherein,

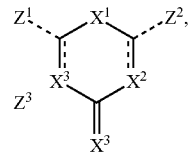
(II)

wherein each of $X^1$-$X^3$ is independently selected from N, O, S, a $sp^2$ hybridized carbon, and $CY^1Y^2$, wherein each of $Y^1$ and $Y^2$ is independently selected from hydrogen, hydroxyl, $C_1$-$C_6$ alkyl, halogen, and combinations thereof, and each of $Z^1$-$Z^3$ is independently selected from hydrogen, hydroxyl, $C_1$-$C_6$ alkyl, and combinations thereof, each of which may be substituted or unsubstituted.

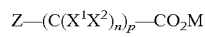

wherein Z is selected from N, $C_1$-$C_6$ alkyl, $C_1$-$C_6$ alkenyl, $C_1$-$C_6$ alkynyl, and aryl (e.g., phenyl, benzyl, naphthyl, azulene, anthracene, pyrene, etc.), $X^1$ and $X^2$ are independently selected from hydrogen, hydroxy, amino, and $C_1$-$C_6$ alkyl, $C_1$-$C_6$ alkenyl, and wherein $X^1$ and $X^2$ taken together with the attached carbon can form a $sp^2$-hybridized carbon, n is 1 or 2, p is 0-4, and M is selected from hydrogen and a suitable counterion (e.g., a group I metal), each of which may be substituted or unsubstituted.

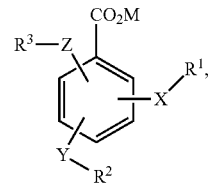
(IV)

where X, Y, and Z are independently selected from H, O, S, NH, and $CH_2$, $R^1$, $R^2$ and $R^3$ are independently selected from H, alkyl, alkenyl, alkynyl, aryl, halo, and haloalkyl, and M is selected from hydrogen and a suitable counterion, (c) an aqueous carrier, wherein the polishing composition has a pH of about 3 to about 9, (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

The invention also provides a method of chemically-mechanically polishing a substrate comprising (i) providing a substrate, wherein the substrate comprises a pattern dielectric layer on a surface of the substrate, wherein the pattern dielectric layer comprises a raised area of dielectric material and a trench area of dielectric material, and wherein the initial step height of the pattern dielectric layer is the difference between the height of the raised area of dielectric material and the height of the trench area of dielectric material, (ii) providing a polishing pad, (iii) providing a chemical-mechanical polishing composition comprising (a) an abrasive comprising ceria, (b) a self-stopping agent selected from hydroxamic acids such as acetohydroxamic acid, benzhydroxamic acid, salicylhydroxamic acid and combinations thereof, (c) a cationic polymer, and (d) an aqueous carrier, wherein the polishing composition has a pH of about 7 to about 9, (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

The polishing compositions of the invention are useful for polishing any suitable substrate. The polishing compositions are particularly useful in the polishing of a substrate comprising a silicon oxide layer. Suitable substrates include, but are not limited to, flat panel displays, integrated circuits, memory or rigid disks, metals, semiconductors, inter-layer dielectric (ILD) devices, microelectromechanical systems (MEMS), 3D NAND devices, ferroelectrics, and magnetic heads. The polishing composition is particularly well-suited for planarizing or polishing a substrate that has undergone shallow trench isolation (STI) processing. Desirably, the substrate includes a dielectric-containing (e.g., silicon oxide-containing) surface, especially one having a region of pattern dielectric material that includes raised dielectric areas separated by trench areas of dielectric material. The substrate can further comprise at least one other layer, e.g., an insulating layer. The insulating layer can be a metal oxide, porous metal oxide, glass, organic polymer, fluorinated organic polymer, or any other suitable high or low-K insulating layer. The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, copper, tantalum, tungsten, titanium, platinum, ruthenium, iridium, aluminum, nickel, or combinations thereof.

In accordance with the invention, a substrate can be planarized or polished with the polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the silicon oxide, or one or more of the substrate materials described herein, with the polishing composition and typically the polishing pad to polish the substrate. Any suitable polishing conditions can be used to polish a substrate according to the invention.

A substrate can be planarized or polished with the chemical-mechanical polishing composition in conjunction with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Although the inventive compositions and methods exhibit self-stopping behavior, the CMP apparatus can further comprise an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

For a substrate of any type of device, the substrate surface can include a continuous yet structured (non-planar, non-smooth) layer of dielectric material that has been placed over a lower layer that also includes surface structure or topography. This structured, non-planar region of the dielectric material surface is referred to as "pattern dielectric." It results from dielectric material being placed over the uneven structure of the lower layer to fill trenches or holes present in the lower layer. To ensure complete filling of all trenches or holes, etc., and full coverage over the surface of the lower layer that contains the trenches or holes, etc., the dielectric material is deposited in an excess amount. The dielectric material will conform to the uneven topography of the lower layer, producing a deposited continuous dielectric surface characterized by raised areas separated by trenches. The raised areas will be the locations of active polishing and material removal, meaning the location from which most of the dielectric material is removed. The pattern dielectric material also is characterized by what is referred to as a "step height," which is the height of the dielectric material of the raised areas relative to the height of the dielectric material at the adjacent trenches.

The inventive polishing composition is particularly well suited for planarizing or polishing a substrate that has undergone shallow trench isolation (STI) or a similar process, whereby dielectric is coated over a structured lower layer to produce regions of pattern dielectric material. For a substrate that has undergone shallow trench isolation, typical step heights can be in a range from about 1,000 angstroms to about 7,000 angstroms.

Certain embodiments of the described polishing composition are also useful for planarizing or polishing a substrate that is an in-process 3D NAND flash memory device. In such substrates, a lower layer is made of semiconductor layer that includes trenches, holes, or other structures that have a high aspect ratio, such as an aspect ratio of at least 10:1, 30:1, 60:1 or 80:1. When a surface having structures of such high aspect ratios is coated by dielectric material, the resultant pattern dielectric will exhibit a high step height, such as a step height that is substantially greater than about 7,000 angstroms, e.g., greater than about 10,000 angstroms, greater than about 20,000 angstroms, greater than about 30,000 angstroms, or greater than about 40,000 angstroms, or more.

The dielectric material of any of the devices described herein may comprise, consist essentially of, or consist of any suitable dielectric material, many of which are well known, including various forms of silicon oxide and silicon oxide-based dielectric materials. For example, a dielectric material that includes silicon oxide or silicon oxide-based dielectric layer can comprise, consist of, or consist essentially of any one or more of: tetraethoxysilane (TEOS), high density plasma (HDP) oxide, phosphosilicate glass (PSG), borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. In the past, some examples of substrates that require planarization of pattern dielectric have been prepared to include a silicon nitride layer (e.g., a "silicon nitride cap" or "liner") at a location below active polishing regions of pattern dielectric material, e.g., a "cap" over a land surface of a structured semiconductor layer. The silicon nitride is designed to cause a stop to polishing and removal of dielectric material at the active region, upon reaching the silicon nitride layer. The silicon nitride layer functions to halt removal of material in a polishing step in a manner intended to reduce trench loss and dishing in final topography. This step, however, adds significant cost to a manufacturing process and still may not fully prevent dishing.

According to methods of the present invention, a substrate may include a silicon nitride liner located at locations of intended ends of a dielectric polishing and removal step. In other embodiments, a substrate does not require and can optionally and preferably exclude a silicon nitride "liner" or "cap" disposed at locations of an end a step of removing dielectric from an active area.

Desirably, pattern dielectric material is planarized and polished to reduce initial step height between raised areas (having initial height) and trenches (having initial trench thickness). To accomplish this planarization effectively and efficiently, the inventive method has a high removal rate of raised areas of (active) pattern dielectric material, along with a substantially lower removal rate of dielectric material of trenches. Most preferably, the inventive method also exhibits self-stopping behavior.

During CMP polishing or planarization, dielectric material is removed from raised areas, and from trenches in smaller amounts. During polishing, the height of raised areas decreases to eventually be essentially level with the height of trenches. This can mean, for example, that step height is reduced to less than 1,000 angstroms, e.g., less than 900 angstroms, less than 500 angstroms, less than 300 angstroms, or less than 250 angstroms. Reducing the height of raised areas removes the pattern of raised areas among the trenches, effectively removing the pattern and converting the pattern to a field of planarized dielectric, i.e., "blanket dielectric or "blanket oxide," meaning a substantially planarized region of dielectric material.

Depending on the substrate being polished, an initial step height may be at least 1,000 angstroms, e.g., at least 2,000 angstroms, or at least 5,000 angstroms, and may be substantially greater, such as greater than 7,000 angstroms, e.g., at least 10,000 angstroms, at least 20,000 angstroms, at least 30,000 angstroms, or at least 40,000 angstroms, measured before beginning a step of CMP processing. After polishing, step height is reduced and trench thickness is reduced.

FIG. 1 depicts an exemplary substrate having an initial step height ($h_0$) and an initial trench thickness ($t_0$). The material of the step height can be mostly dielectric such as TEOS, BPSG, or other amorphous silica-containing materials. The key step in 3D NAND dielectric (and other bulk oxide removal) processing is to reduce step height ($h_1$) (e.g., to less than about 1,000 Å, or to less than about 900 Å) with minimal trench loss ($t_0-t_1$). For good planarization efficiency, the final step height must be achieved without significant trench loss. This requires a polishing composition with a higher removal rate on the active (i.e., raised) areas than at the trench area. Additionally, preferred polishing compositions will result in a "self-stopping" or "stop on planar" behavior, to allow for more effective final polishing that does not cause over-polishing. Desirably, the inventive polishing composition has a much higher pattern removal rate (removal rate at active areas) compared to the removal rate on blanket (substantially smooth) dielectric material.

Removal rate of dielectric material at active areas is referred to as a removal rate of pattern material (e.g., pattern oxide) or "pattern removal rate" or "active removal rate." The pattern removal rate achieved using a method and polishing composition as described herein can be any suitable rate, and for any given process and substrate will depend in great part on the dimensions (e.g., pitch and width) of the raised areas. According to preferred methods, the removal rate of pattern dielectric material can be at least about 2,000 angstroms per minute, preferably at least about 4,000 angstroms per minute, e.g., at least about 5,000 angstroms per minute, at least about 6,000 angstroms per minute, at least about 10,000 angstroms per minute, at least about 14,000 angstroms per minute, or at least about 15,000 angstroms per minute.

According to preferred methods, the pattern dielectric can be processed to a planarized surface by CMP processing of the pattern dielectric for a time that is less than 5 minutes, e.g., less than 3 minutes, less than 2 minutes, or less than 1 minute. This can be accomplished for a substrate with pattern dielectric material that includes a step height of at least 7,000 angstroms, e.g., at least 10,000 angstroms, at least 20,000 angstroms, at least 30,000 angstroms, or at least 40,000 angstroms. The surface is considered to be effectively planarized upon achieving a reduced (by polishing) step height (i.e., a "remaining" step height) of less than 1,000 angstroms. Thus, the inventive polishing composition and methods can provide a remaining step height of less than 1,000 angstroms, e.g., less than 900 angstroms, less than 500 angstroms, less than 300 angstroms, or less than 250 angstroms.

Also, according to preferred polishing methods using polishing compositions as described herein, trench loss can be reduced and planarization efficiency can be improved relative to polishing compositions that do not contain a self-stopping agent as described herein (e.g., a compound of the formula Q-B). Trench loss refers to the difference between a thickness of a trench ($t_0$) before CMP processing, less the thickness of the trench after CMP processing ($t_1$), i.e., trench loss equals $t_0-t_1$ (for a given processing time or result) (FIG. 1). Preferably, the amount of trench loss that will occur during polishing to planarization (defined, e.g., by a "remaining" step height of less than 1,000 angstroms, e.g., less than 900 angstroms, less than 500 angstroms, less than 300 angstroms, or less than 250 angstroms), or for a given amount of processing time, can be decreased by the presence of a self-stopping agent as described herein in a polishing composition as described herein. Thus, the polishing method described herein will result in a trench loss that is substantially less than (e.g., at least 10 percent less than) the trench loss that would occur using the same process conditions and equipment to polish the same type of substrate with a polishing composition that is similar but does not contain a self-stopping agent as described herein (e.g., a polishing composition that does not contain a compound of the formula Q-B). Desirably, the inventive method of polishing a substrate provides a trench loss of less than about 2,000 angstroms (e.g., less than about 1,500 angstroms, less than about 1,000 angstroms, less than about 500 angstroms, or less than about 250 angstroms).

A lower trench loss can be reflected in planarization efficiency, which refers to step height reduction (A) divided by trench loss (A). According to preferred methods of the present invention, planarization efficiency can be improved by the presence of a self-stopping agent as described herein in a polishing composition as described herein. Thus, the polishing method described herein will result in a planarization efficiency that is substantially greater than (e.g., at least 10 percent greater than) the planarization efficiency that would occur using identical process conditions and equipment to polish the same type of substrate with a polishing composition that is similar but does not containing a self-stopping agent as described herein (e.g., a polishing composition that does not contain a compound of the formula Q-B). Desirably, the inventive method of polishing a substrate provides a planarization efficiency of at least about 2.0, preferably at least about 3.0, such as at least about 3.5.

Preferred methods also can exhibit self-stopping behavior, meaning that the removal rate of dielectric material from blanket dielectric material (upon reaching a step height of less than 1,000 angstroms, less than 900 angstroms, less than 500 angstroms, less than 300 angstroms, or less than 200 angstroms) (i.e., the "blanket removal rate") is significantly lower than the removal rate of pattern dielectric material. Self-stopping behavior is considered to occur if a removal rate of blanket dielectric material is less than about 1,000 angstroms per minute. Thus, in a preferred embodiment, the inventive method provides a blanket dielectric material removal rate of less than about 1,000 angstroms per minute, e.g., less than about 800 angstroms per minute, less than about 500 angstroms per minute, less than about 300 angstroms per minute, or less than about 200 angstroms per minute.

By another measure, self-stopping behavior may be measured by comparing the removal rate of blanket dielectric material to the removal rate of pattern dielectric material. A low ratio of blanket removal rate to pattern removal rate indicates good self-stopping behavior. Thus, in a preferred embodiment, the ratio of the removal rate of blanket dielectric material to the removal rate of pattern dielectric material is less than about 1, e.g., less than about 0.5, less than about 0.3, or less than about 0.1. Accordingly, the inventive polishing method will result in a ratio of blanket removal rate to pattern removal rate that is substantially less than (e.g., at least about 10 percent less than) the ratio of blanket removal rate to pattern removal rate that would occur using the same process conditions and equipment to polish the same type of substrate with a polishing composition that is similar but does not contain a self-stopping agent as described herein (e.g. a polishing composition that does not contain a compound of the formula Q-B).

In an embodiment, the invention provides a method wherein the pattern dielectric layer includes an initial step height of at least about 1,000 angstroms, wherein the method comprises reducing the initial step height to less than about 900 angstroms during polishing to produce a planarized dielectric, and wherein the removal rate of the planarized dielectric is less than about 1,000 angstroms per minute.

In an embodiment, the present invention provides a method comprising removing at least about 10,000 angstroms of the raised area of dielectric material from the surface of the pattern dielectric layer.

In an embodiment, the present invention provides a method wherein the ratio of the removal rate of the raised area of dielectric material to the removal rate of the trench area of dielectric material is greater than about 5, preferably greater than about 10, greater than about 15, or greater than about 20.

In an embodiment, the present invention provides a method wherein the removal rate of the raised area of dielectric material is greater than about 1000 angstroms per minute. Thus, in a preferred embodiment, the removal rate of the raised area of dielectric material is greater than about 2,000 angstroms per minute, e.g., greater than about 4,000 angstroms per minute, greater than about 5,000 angstroms per minute, greater than about 6,000 angstroms per minute, greater than about 10,000 angstroms per minute, or greater than about 15,000 angstroms per minute.

In an embodiment, the present invention provides a method wherein the pattern dielectric layer comprises dielectric material selected from silicon oxide, tetraethoxysilane, phosphosilicate glass, borophosphosilicate glass, and combinations thereof.

EMBODIMENTS (1) In embodiment (1) is presented a chemical-mechanical polishing composition comprising (a) an abrasive, (b) a self-stopping agent of the formula Q-B, wherein Q is a substituted or unsubstituted hydrophobic group, or a group imparting a steric hindrance, B is a binding group, wherein the binding group has the structure; —C(O)—X—OH or —C(O)—OH, wherein X is a C1-C2 alkyl group, (for example, any compound of formulas (II), (III) and (IV)); and (c) an aqueous carrier, wherein the polishing composition has a pH of about 3 to about 9.

(2) In embodiment (2) is presented the polishing composition of embodiment (1), wherein the abrasive is selected from ceria, zirconia, and combinations thereof.

(3) In embodiment (3) is presented the polishing composition of embodiment (2), wherein the abrasive is ceria.

(4) In embodiment (4) is presented the polishing composition of any one of embodiments (1)-(3), wherein the abrasive is present in the polishing composition at a concentration of about 0.001 wt. % to about 5 wt. %.

(5) In embodiment (5) is presented the polishing composition of any one of embodiments (1)-(4), wherein Q is selected from an alkyl group, a cycloalkyl group, an aromatic group, a heterocyclic group, a heteroaromatic group, and combinations thereof.

(6) In embodiment (6) is presented the polishing composition of embodiment (5), wherein Q is substituted with one or more groups selected from a hydroxyl group, an alkyl group, a halogen, an amine group, or any combination thereof.

(7) In embodiment (7) is presented the polishing composition of embodiment (1), wherein Q-B is selected from maltol, kojic acid, crotonic acid, tiglic acid, 2-pentenoic acid, valeric acid, benzoic acid, 3,4-dihydroxybenzoic acid, 3,5-dihydroxybenzoic acid, caffeic acid, ethyl maltol, potassium sorbate, sorbic acid, and combinations thereof.

(8) In embodiment (8) is presented the polishing composition of any one of embodiments (1)-(7), wherein the self-stopping agent is present in the polishing composition at a concentration of about 0.5 wt. % or less.

(9) In embodiment (9) is presented the polishing composition of any one of embodiments (1)-(8), further comprising a cationic polymer.

(10) In embodiment (10) is presented the polishing composition of embodiment (9), wherein the cationic polymer comprises monomers selected from quaternary amines, cationic polyvinyl alcohols, cationic cellulose, and combinations thereof.

(11) In embodiment (11) is presented the polishing composition of embodiment (10), wherein the cationic polymer comprises quaternary amine monomers, and wherein the quaternary amine monomers are selected from vinylimidazolium, methacryloyloxyethyltrimethylammonium halide, diallyldimethylammonium halide, and combinations thereof.

(12) In embodiment (12) is presented the polishing composition of embodiment (9), wherein the cationic polymer is selected from poly(vinylimidazolium), poly(methacryloyloxyethyltrimethylammonium) chloride, poly(diallyldimethylammonium) chloride, polyquaternium-2, and combinations thereof.

(13) In embodiment (13) is presented the polishing composition of any one of embodiments (1)-(12), wherein the polishing composition has a pH of about 6.5 to about 8.5.

(14) In embodiment (14) is presented the polishing composition of any one of embodiments (1)-(12), wherein the polishing composition has a pH of about 3 to about 5.

(15) In embodiment (15) is presented the polishing composition of any one of embodiments (1)-(14), further comprising a rate enhancer and/or a pH buffer.

(16) In embodiment (16) is presented a chemical-mechanical polishing composition comprising (a) an abrasive comprising ceria, (b) a self-stopping agent selected from kojic acid, crotonic acid, tiglic acid, valeric acid, 2-pentenoic acid, maltol, benzoic acid, 3,4-dihydroxybenzoic acid, 3,5-dihydroxybenzoic acid, caffeic acid, ethyl maltol, potassium sorbate, sorbic acid, and combinations thereof, and (c) an aqueous carrier, wherein the polishing composition has a pH of about 3 to about 9.

(7) In embodiment (17) is presented the polishing composition of embodiment (16), wherein the polishing composition has a pH of about 3 to about 5.

(18) In embodiment (18) is presented the polishing composition of embodiment (16), further comprising a planarizing agent comprising a cationic polymer selected from poly(vinylimidazolium), poly(methacryloyloxyethyltrimethylammonium) chloride, poly(diallyldimethylammonium) chloride, polyquatemium-2, and combinations thereof.

(19) In embodiment (19) is presented the polishing composition of embodiment (18), wherein the polishing composition has a pH of about 6.5 to about 8.5.

(20) In embodiment (20) is presented a chemical-mechanical polishing composition comprising (a) an abrasive comprising ceria, (b) a self-stopping agent selected from a compound of formula (I):

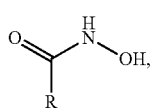

(I)

wherein R is selected from the group consisting of hydrogen, alkyl, cycloalkyl, aryl, heterocyclic alkyl, and heterocyclic aryl, each of which may be substituted or unsubstituted; (c) a cationic compound selected from aluminum salts, 2-(dimethylamino)ethyl methacrylate, diallyldimethylammonium, poly(vinylimidazolium), poly(methacryloyloxyethyltrimethylammonium) halide, poly(diallyldimethylammonium) halide, polyquaternium-2, Polyquaternium-11, Polyquaternium-16, Polyquaternium-46, Polyquaternium-44, Luviquat Supreme, Luviquat Hold, Luviquat UltraCare, Luviquat FC 370, Luviquat FC 550, Luviquat FC 552, Luviquat Excellence, and combinations thereof, and (d) an aqueous carrier, wherein the polishing composition has a pH of about 7 to about 9.

(21) In embodiment (21) is presented the polishing composition of embodiment (20), wherein the polishing composition has a pH of about 7 to about 9.

(22) In embodiment (22) is presented a method of chemically-mechanically polishing a substrate comprising (i) providing a substrate, wherein the substrate comprises a pattern dielectric layer on a surface of the substrate, wherein the pattern dielectric layer comprises a raised area of dielectric material and a trench area of dielectric material, and wherein the initial step height of the pattern dielectric layer is the difference between the height of the raised area of dielectric material and the height of the trench area of dielectric material, (ii) providing a polishing pad, (iii) providing the chemical-mechanical polishing composition of any one embodiments (1)-(21), (iv) contacting the substrate with the polishing pad and the chemical-mechanical polishing composition, and (v) moving the polishing pad and the chemical-mechanical polishing composition relative to the substrate to abrade at least a portion of the pattern dielectric layer on a surface of the substrate to polish the substrate.

(23) In embodiment (23) is presented the polishing method of embodiment (22), wherein the pattern dielectric layer includes an initial step height of at least about 1,000 angstroms, wherein the method comprises reducing the initial step height to less than about 900 angstroms during polishing to produce a planarized dielectric, and wherein the removal rate of the planarized dielectric is less than about 1,000 angstroms per minute.

(24) In embodiment (24) is presented the polishing method of embodiment (22) or embodiment (23), wherein the method comprises removing at least about 10,000 angstroms of the raised area of dielectric material from the of the pattern dielectric layer.

(25) In embodiment (25) is presented the polishing method of any one of embodiments (22)-(24), wherein the ratio of the removal rate of the raised area of dielectric material to the removal rate of the trench area of dielectric material is greater than about 5.

(26) In embodiment (26) is presented the polishing method of any one of embodiments (22)-(25), wherein the removal rate of the raised area of dielectric material is greater than about 1,000 angstroms per minute.

(27) In embodiment (27) is presented the polishing method of any one of embodiments (22)-(26), wherein the pattern dielectric layer comprises dielectric material selected from silicon oxide, tetraethoxysilane, phosphosilicate glass, borophosphosilicate glass, and combinations thereof.

EXAMPLES

The following examples further illustrate the invention but, of course, should not be construed as in any way limiting its scope.

The following abbreviations are used in the examples PEG8000 refers to polyethylene glycol having a molecular weight of 8,000 g/mol; pMADQUAT refers to polyMADQUAT; SHA refers to salicylhydroxamic acid; BHA refers to benzhydroxamic acid; BTA refers to 1H-benzotriazole; TEA refers to triethanolamine; POU refers to point-of-use; RR refers to removal rate; AA refers to Active Area; TA refers to Trench Area; BW refers to TEOS blanket wafer; and SH refers to step-height.

Example 1

This example demonstrates the effect of a self-stopping agent, optionally in combination with a cationic compound, on polishing performance in polishing compositions comprising the same.

Pattern substrates were polished with fourteen polishing compositions (i.e., Polishing Compositions 1A-1N). Polishing Compositions 1A-1N were prepared by mixing Abrasive Compositions C1 and C2 (described below in Table 1) with Additive Formulations F1-F15 (described below in Table 2) in a 7:3 ratio by volume.

Abrasive Compositions C1 and C2 contained ceria abrasive, picolinic acid, and water, as set forth in Table 1. The HC60 and HC30 ceria abrasives are commercially available from Rhodia. The H-30 ceria abrasive is a wet process ceria described in a previous application (U.S. Published Patent Application 2016/0257855). Abrasive compositions C1 and C2 each had a pH of 4.2.

TABLE 1

| Abrasive Compositions | | |
|---|---|---|
| Composition | Ceria (wt. %) | Picolinic acid (ppm) |
| C1 | HC60 (0.14) HC30 (0.14) | 714 |
| C2 | H-30 (0.29) | 500 |

Additive Formulations F4-F15 contained cationic compound (pMADQUAT), self-stopping agent (SHA or BHA), and additive (BTA) as set forth in Table 2. The pH of each of Additive Formulations F3-F15 was adjusted using triethanolamine (TEA). Additive Formulations F1 and F2 did not contain a base and had a pH of 4.2.

TABLE 2

| Additive Formulations | | | | |
|---|---|---|---|---|
| Formulation | Cationic Compound (ppm) | Self-Stopping Agent (ppm) | Additional Components (wt. %) | Formulation pH |
| F1 | — | SHA (840) | — | 4.2 |
| F2 | — | BHA (1,250) | PEG8000 (0.835) | 4.2 |
| F3 | — | SHA (840) | — | 8.2 |
| F4 | pMADQUAT (140) | SHA (840) | BTA (0.16) | 8.2 |
| F5 | pMADQUAT (170) | SHA (1,030) | BTA (0.16) | 8.2 |
| F6 | pMADQUAT (170) | SHA (1,030) | BTA (0.16) | 9.1 |
| F7 | pMADQUAT (170) | SHA (1,350) | BTA (0.16) | 8.2 |
| F8 | pMADQUAT (200) | SHA (1,400) | BTA (0.16) | 8.2 |
| F9 | pMADQUAT (200) | SHA (1,400) | BTA (0.16) | 7.5 |
| F10 | pMADQUAT (200) | BHA (840) | BTA (0.16) | 8.2 |
| F11 | pMADQUAT (200) | SHA (1,000) BHA (840) | BTA (0.16) | 8.2 |
| F12 | pMADQUAT (250) | BHA (1,670) | BTA (0.16) | 8.2 |
| F13 | pMADQUAT (270) | SHA (840) | BTA (0.16) | 8.2 |
| F14 | pMADQUAT (270) | SHA (840) | BTA (0.16) | 8.2 |
| F15 | pMADQUAT (270) | BHA (840) | BTA (0.16) | 8.2 |

Separate patterned coupon substrates (a square cut having 40 mm on each side of a SKW 7-2 wafer from SKW Associates, Inc.) comprising 250 μm TEOS features with a 50% pattern density (approximately 20,000 Å thick features) initially coated on patterned silicon substrates having a step-height of approximately 8,000 Å were polished for 60 sec on a POLI-300 (G&P Tech. Inc.) having a 200 mm CMP platen using an IC1010™ pad (Rohm and Haas Electronic Materials) at 20.68 kPa (3 psi) down force, with 120 rpm and 110 rpm of platen speed and head speed, respectively. The total flow rate of the polishing composition was 200 mL/min. The results are set forth in Table 3.

TABLE 3

| Effect of Cationic Compound and pH on Polishing Performance | | | | | |
|---|---|---|---|---|---|
| Polishing Composition | Abrasive & Additive Compositions (7:3) | pH (POU) | AA Removal (Å) | TA Removal (Å) | Ratio AA:TA |
| 1A (comparative) | C1, F1 | 4.2 | 11,224 | 3,671 | 3.06 |
| 1B (comparative) | C1, F3 | 4.2 | 8,643 | 1,460 | 5.92 |
| 1C (inventive) | C1, F4 | 7.6 | 8,984 | 1,279 | 7.02 |
| 1D (inventive) | C1, F5 | 7.6 | 7,412 | 725 | 10.22 |
| 1E (inventive) | C1, F6 | 8.8 | 8,795 | 1,526 | 5.76 |
| 1F (inventive) | C1, F7 | 7.6 | 8,328 | 794 | 10.49 |
| 1G (inventive) | C1, F8 | 7.6 | 5,557 | 280 | 19.85 |
| 1H (inventive) | C2, F8 | 7.7 | 6,511 | 322 | 20.22 |
| 1I (comparative) | C1, F9 | 6.1 | 777 | 90 | 8.63 |
| 1J (inventive) | C1, F10 | 7.6 | 9,045 | 717 | 12.62 |
| 1K (inventive) | C1, F11 | 7.6 | 6,739 | 229 | 29.43 |
| 1L (inventive) | C1, F12 | 7.6 | 7,776 | 589 | 13.20 |
| 1M (inventive) | C2, F14 | 7.7 | 7,925 | 625 | 12.68 |
| 1N (inventive) | C1, F15 | 7.6 | 4,731 | 95 | 49.80 |

As is apparent from the results set forth in Table 3, Polishing Compositions 1A and 1B, which comprise an abrasive formulation with a self-stopping agent (hydroxamic acid) at an acidic pH (pH 4.2), desirably exhibited a ratio of active area removal to trench area removal in a range of approximately 3 to 6. Thus, Polishing Compositions 1A and 1B desirably are "self-stopping" compositions, which planarize pattern material while preserving trench material.

Polishing Composition 1I, which comprises both a self-stopping agent and a cationic compound, exhibited a ratio of active area removal to trench area removal of approximately 8.6, and an active area removal of 777 Å at a pH of 6.1. Thus, Polishing Composition 1I also is a "self-stopping" composition, which planarizes pattern material while preserving trench material.

Polishing Compositions 1C-1H, and 1J-1N, which comprise both a self-stopping agent and a cationic compound, exhibited a ratio of active area removal to trench area removal ranging from about 5.76:1 to about 50:1 and an active area removal of about 4,700 Å to about 9,000 Å at a pH of 7.6-8.8. Thus, Polishing Compositions 1C-1H, and 1J-1N are "self-stopping" compositions, which planarize pattern material while preserving trench material.

Example 2

This example demonstrates the effect of a self-stopping agent, optionally in combination with a cationic compound, on polishing performance in polishing compositions comprising the same.

Pattern substrates were polished with three polishing compositions (i.e., Polishing Compositions 2A-2C). Polishing Compositions 2B and 2C were prepared using the Abrasive Compositions and Additive Formulations described in Example 1 (7:3 by volume). Composition 2A (comparative) contained only Abrasive Formulation C2.

Separate patterned substrates obtained from Silyb Inc. comprising TEOS (approximately 10,000 Å thick features) initially coated on patterned silicon substrates with various widths and density having a step-height of approximately 5,000 Å were polished for various times on an AP-300™ (CTS Co., Ltd.) having a 300 mm CMP platen using an IC1010™ pad at 3 psi down force, with 93 rpm and 87 rpm of platen speed and head speed, respectively. The total flow rate of the polishing composition was 250 mL/min.

TABLE 4

Description of Polishing Compositions 2A-2C

| Polishing Composition | Abrasive & Additive Compositions (7:3) | pH (POU) | Polishing Time (s) |
|---|---|---|---|
| 2A (comparative) | C2 | 4.2 | 35 |
| 2B (inventive) | C2:F2 | 4.2 | 35 and 45 |
| 2C (inventive) | C2:F12 | 7.7 | 30, 60, and 90 |

Figure 2:
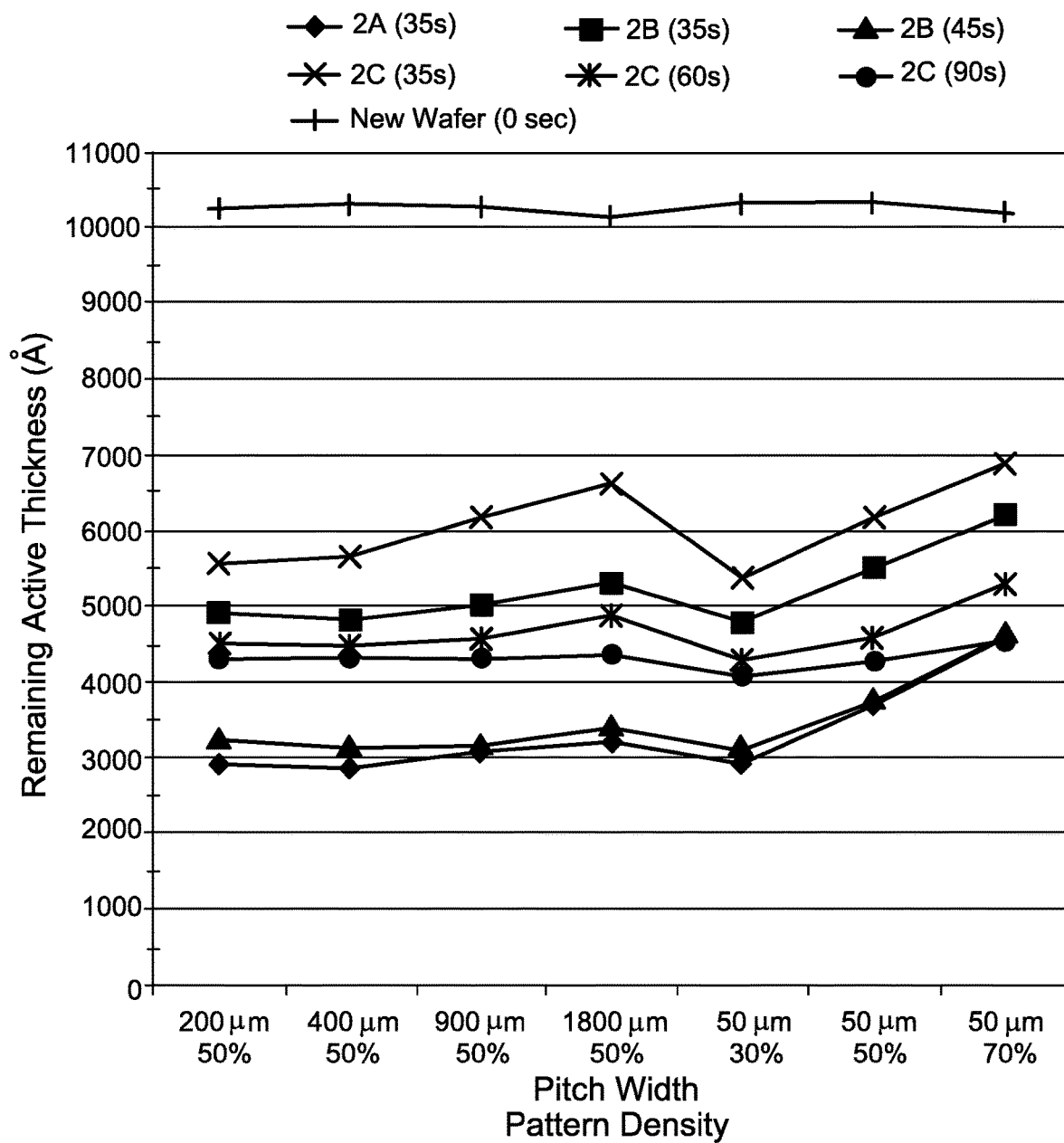
FIG. 2 illustrates the polishing performance of an inventive polishing composition as a function of pitch width and pattern density of a substrate.

The remaining active thicknesses before and after polishing depending upon pitch and pattern density as results of Example 2 are graphically represented in FIG. 2.

As is apparent from the results represented in FIG. 2, Inventive Polishing Composition 2C, which contains abrasive, benzhydroxamic acid, and polyMADQUAT at a pH of 7.7 (POU), exhibited low pattern density dependence as polishing time increased, and the stopping occurs with uniform topography over the substrate (Polishing Composition 2C polishing for 90 s) when compared to Polishing Compositions 2A and 2B.

Additional polishing performance data is set forth in Table 5 and FIG. 2. Data in Table 5 depicts the remaining active thicknesses, which comprise 900 μm TEOS features (50% pattern density), over the wafer as a function of polishing time.

TABLE 5

Remaining Silicon Oxide as a Function of Polishing Time

| Polishing Composition | Polishing Time (s) | AA Thickness (Å) | | | TA Thickness (Å) | | | Step Height (Å) | | |
|---|---|---|---|---|---|---|---|---|---|---|
| | | Center | Mid | Edge | Center | Mid | Edge | Center | Mid | Edge |
| No Polishing | 0 | 10394 | 10338 | 10224 | 10363 | 10307 | 10200 | 5045 | 5111 | 5074 |
| 2A (comparative) | 15 | 7181 | 7100 | 7320 | 9758 | 9642 | 9237 | 2544 | 2638 | 2986 |
| | 35 | 3004 | 2910 | 3380 | 7728 | 7743 | 7785 | 378 | 255 | 513 |
| 2B (comparative) | 30 | 5574 | 5476 | 5865 | 9908 | 9883 | 9616 | 874 | 983 | 1273 |
| | 45 | 3297 | 3291 | 3774 | 8314 | 8434 | 8498 | 148 | 133 | 382 |
| 2C (inventive) | 30 | 6222 | 6096 | 7303 | 9869 | 9855 | 10033 | 1416 | 1302 | 2009 |
| | 60 | 4504 | 4464 | 5637 | 9369 | 9427 | 9759 | 327 | 412 | 738 |
| | 90 | 4355 | 4333 | 4668 | 9209 | 9217 | 9292 | 327 | 416 | 299 |

As is apparent from the results set forth in Table 5 and FIG. 2, Polishing Composition 2C initially exhibited a lower polishing rate on the pattern material, but the rate drops uniformly over the wafer as the step height decreases, as compared to comparative (Polishing Compositions 2A and 2B). This example further demonstrates the advantage of self-stopping polishing compositions formulated in a pH range of about 7.0 to about 8.5 at point-of-use with a self-stopping agent (e.g., hydroxamic acid) and a cationic compound (e.g., pMADQUAT) with regard to topography variations over the substrate (pattern density dependence) and within wafer polishing rate variations (WIWNU) as compared to a control polishing composition.

Example 3

This example demonstrates the effect of self-stopping agents and pH ranges of the present invention, optionally in combination with a cationic compound, on polishing performance.

Pattern substrates and TEOS-coated silicon substrates were polished with the fourteen polishing compositions described in Table 7 below (i.e., Polishing Compositions 3A-3N). The polishing compositions were prepared by mixing the Abrasive Compositions (described in Table 1) and the Additive Formulations described in Table 6, in a 7:3 ratio by volume.

Additive Formulations G1-G5 contained no cationic compound, whereas formulations G6-G14 contained a cationic compound (i.e. pMADQUAT or Luviquat Supreme). All formulations contained a self-stopping agent, and additional components as set forth in Table 6.

TABLE 6

Additive Formulations

| Formulation | Cationic Compound (ppm) | Self-Stopping Agent (ppm) | Additional Components (ppm) | pH |
|---|---|---|---|---|
| G1 | — | Acetohydroxamic acid (3333) | — | 4.0 |
| G2 | — | Maltol (6667) | — | 4.0 |
| G3 | — | Ethyl maltol (6667) | — | 4.0 |
| G4 | — | Deferiprone (1667) | — | 4.0 |
| G5 | — | 2-Hydroxynicotinic acid (1667) | — | 4.0 |
| G6 | pMADQUAT (167) | Acetohydroxamic acid (1667) | Acetic acid (1500) | 5.0 |
| G7 | pMADQUAT (100) | Maltol (3333) | Acetic acid (1500) | 5.0 |
| G8 | pMADQUAT (100) | Potassium sorbate (1667) | Acetic acid (1500) | 4.0 |
| G9 | pMADQUAT (150) | Tiglic acid (1667) | Brij S20 (667) Acetic acid (1500) | 4.0 |
| G10 | pMADQUAT (150) | Crotonic acid (5000) | Brij S20 (667) | 4.0 |
| G11 | pMADQUAT (150) | 2-pentenoic acid (1667) | Brij S20 (667) Acetic acid (1500) | 4.0 |
| G12 | pMADQUAT (167) | Valeric acid (3333) | Acetic acid (1500) | 4.0 |
| G13 | pMADQUAT (150) | BHA (1670) | Bis-Tris (4000) PEG8000 (1670) | 7.0 |
| G14 | Luviquat Supreme (333) | BHA (1670) | BTA (1600) TEA (4000) | 8.2 |

Patterned wafers were obtained from Silyb Inc., and comprised 900 μm TEOS features with a 50% pattern density (approximately 10,000 Å thick features) initially coated on patterned silicon substrates having a step-height of approximately 5,000 Å. TEOS blanket wafers obtained from WRS materials. The test wafers were polished using a MIRRA™ polishing tool (Applied Materials, Inc.) for 60 seconds and 90 seconds, for the pattern wafers and blanket wafers, respectively. A NexPlanar® E6088 (Cabot Microelectronics Corporation) polishing pad was used on a 200 mm platen, using 3 psi down force, and 93 rpm and 87 rpm for the platen speed and head speed, respectively. The total slurry flow rate was 150 mL/min. The results are set forth in Table 7.

TABLE 7

Effect of Additives and POU pH on Polishing Performance

| Polishing Composition | Abrasive & Additive Compositions (7:3) | pH (POU) | SH RR (Å/min) | BW RR (Å/min) | Ratio SH:BW |
|---|---|---|---|---|---|
| 3A (inventive) | C2, G1 | 4.0 | 3059 | 506 | 6.04 |
| 3B (inventive) | C2, G2 | 3.9 | 3242 | 185 | 17.52 |
| 3C (inventive) | C2, G3 | 4.0 | 2940 | 213 | 13.80 |
| 3D (inventive) | C2, G4 | 4.0 | 2237 | 259 | 8.64 |
| 3E (inventive) | C2, G5 | 4.0 | 2285 | 543 | 4.21 |
| 3F (inventive) | C2, G6 | 4.8 | 2358 | 147 | 16.04 |
| 3G (inventive) | C2, G7 | 4.8 | 2710 | 212 | 12.78 |
| 3H (inventive) | C2, G8 | 4.0 | 2550 | 247 | 10.32 |
| 3I (inventive) | C2, G9 | 4.0 | 2691 | 525 | 5.13 |
| 3J (inventive) | C2, G10 | 4.0 | 2679 | 259 | 10.34 |
| 3K (inventive) | C2, G11 | 4.0 | 2727 | 353 | 7.72 |
| 3L (inventive) | C2, G12 | 4.0 | 2598 | 330 | 7.87 |
| 3M (inventive) | C2, G13 | 6.1 | 2404 | 100 | 24.04 |
| 3N (inventive) | C2, G14 | 7.7 | 2697 | 540 | 4.99 |

As is apparent from the results set forth in Table 7, all Polishing Compositions comprising an abrasive formulation with a self-stopping agent exhibited high step-height removal rate on pattern, and low oxide removal rate on blanket wafer. This indicates significant removal rate drop occurs on pattern wafer as it is planarized. A ratio of step-height removal rate to oxide blanket removal rate was in a range of approximately 4 to 24, depending on the type of a self-stopping agent, in combination with POU pH and a cationic compound.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive selected from ceria, zirconia, and combinations thereof,
   (b) a self-stopping agent selected from a compound of formula (I):

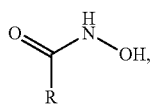

wherein R is selected from the group consisting of hydrogen, alkyl, cycloalkyl, aryl, heterocyclic alkyl, and heterocyclic aryl, each of which may be substituted or unsubstituted;
   (c) a cationic polymer, wherein the cationic polymer comprises a quaternary amine,
   (d) an aqueous carrier,
wherein the polishing composition has a pH of about 7 to about 9.

2. The polishing composition of claim 1, wherein the self-stopping agent is selected from hydroxamic acid, acetohydroxamic acid benzhydroxamic acid, salicylhydroxamic acid and combinations thereof.

3. The polishing composition of claim 1, wherein the cationic polymer is selected from, 2-(dimethylamino)ethyl methacrylate, diallyldimethylammonium, poly(vinylimidazolium), poly(methacryoyloxyethyltrimethylammonium) halide, poly(diallyldimethylammonium)chloride, polyquaternium-2, Polyquaternium-11, Polyquaternium-16, Polyquaternium-46, Polyquaternium-44, Luviquat Supreme, Luviquat Hold, Luviquat UltraCare, Luviquat FC 370, Luviquat FC 550, Luviquat FC 552, Luviquat Excellence, and combinations thereof.

4. The polishing composition of claim 1, wherein the polishing composition further comprises a rate enhancer.

5. The polishing composition of claim 1, wherein the self-stopping agent is present in the polishing composition at a concentration of about 1 wt % or less.

6. The polishing composition of claim 1, wherein the abrasive is ceria.

7. The polishing composition of claim 1, wherein the abrasive is present in the polishing composition at a concentration of about 0.001 wt. % to about 5 wt. %.

8. A method of chemically-mechanically polishing a substrate comprising:
   (i) providing a substrate, wherein the substrate comprises a pattern dielectric layer on a surface of the substrate,
   (ii) providing a polishing pad,
   (iii) providing the chemical-mechanical polishing composition of claim 1,
   (iv) contacting the substrate with the polishing pad and the chemical-mechanical polishing composition, and
   (v) moving the polishing pad and the chemical-mechanical polishing composition relative to the substrate to abrade at least a portion of the pattern dielectric layer on a surface of the substrate to polish the substrate.

* * * * *